United States Patent
Kaneko et al.

(10) Patent No.: US 10,012,675 B2
(45) Date of Patent: Jul. 3, 2018

(54) NANOMETER STANDARD PROTOTYPE AND METHOD FOR MANUFACTURING NANOMETER STANDARD PROTOTYPE

(75) Inventors: Tadaaki Kaneko, Sanda (JP); Shoji Ushio, Sanda (JP)

(73) Assignee: KWANSEI GAKUIN EDUCATIONAL FOUNDATION, Nishinomiya-shi, Hyogo (JP)

( * ) Notice: Subject to any disclaimer, the term of this patent is extended or adjusted under 35 U.S.C. 154(b) by 549 days.

(21) Appl. No.: 14/357,379

(22) PCT Filed: Nov. 11, 2011

(86) PCT No.: PCT/JP2011/006313
§ 371 (c)(1),
(2), (4) Date: Jun. 18, 2014

(87) PCT Pub. No.: WO2013/069067
PCT Pub. Date: May 16, 2013

(65) Prior Publication Data
US 2014/0317791 A1 Oct. 23, 2014

(51) Int. Cl.
*C30B 29/36* (2006.01)
*G01Q 40/02* (2010.01)
(Continued)

(52) U.S. Cl.
CPC ............. *G01Q 40/02* (2013.01); *C30B 23/02* (2013.01); *C30B 25/02* (2013.01); *C30B 29/36* (2013.01);
(Continued)

(58) Field of Classification Search
CPC ......... C30B 29/36; C30B 25/02; C30B 33/00; C30B 23/02; C30B 33/08;
(Continued)

(56) References Cited

U.S. PATENT DOCUMENTS 6,083,812 A * 7/2000 Summerfelt ........ H01L 21/0445
117/950
6,270,573 B1 8/2001 Kitabatake et al.
(Continued)

FOREIGN PATENT DOCUMENTS

JP 6-58753 A 3/1994
JP 2006-40999 A 2/2006
(Continued)

OTHER PUBLICATIONS

European Patent Office, English computer translation of JP2008016691 (2017).*
(Continued)

*Primary Examiner* — Matthew Song
(74) *Attorney, Agent, or Firm* — Westerman, Hattori, Daniels & Adrian, LLP

(57) ABSTRACT

A standard sample (72) that is a nanometer standard prototype, having a standard length that serves as a length reference, includes a SiC layer in which a step-terrace structure is formed. The height of a step, used as the standard length, is equal to the height of a full unit that corresponds to one periodic of a stack of SiC molecules in a stack direction or equal to the height of a half unit that corresponds to one-half periodic of the stack of SiC molecules in the stack direction. In a microscope such as an STM to be measured in a high-temperature vacuum environment, heating in a vacuum furnace enables surface reconstruction with ordered atomic arrangement, while removing a natural oxide film from the surface, so that accuracy of the height of the step is not degraded. Accordingly, a standard sample usable under a high-temperature vacuum is achieved.

19 Claims, 17 Drawing Sheets

(a) SiC substrate surface after mechanically polished (b) SiC substrate surface after vapor-etching planarization (c) SiC substrate surface after formation of steps having uniform terrace width

(51) Int. Cl.
| | |
|---|---|
| *C30B 23/02* | (2006.01) |
| *C30B 25/02* | (2006.01) |
| *H01L 29/16* | (2006.01) |
| *C30B 33/12* | (2006.01) |
| *H01L 21/02* | (2006.01) |

(52) U.S. Cl.
CPC ........ *C30B 33/12* (2013.01); *H01L 21/02378* (2013.01); *H01L 29/1608* (2013.01); *H01L 21/02529* (2013.01)

(58) Field of Classification Search
CPC ........... H01L 21/02378; H01L 29/1608; H01L 21/02529; H01L 21/02447
See application file for complete search history.

(56) References Cited

U.S. PATENT DOCUMENTS

| | | | | |
|---|---|---|---|---|
| 6,869,480 | B1* | 3/2005 | Abel | B82Y 35/00 117/101 |
| 2003/0059568 | A1* | 3/2003 | Pickering | C23C 16/01 428/66.6 |
| 2007/0096109 | A1* | 5/2007 | Seki | C30B 25/02 257/77 |
| 2012/0146056 | A1 | 6/2012 | Momose et al. | |

FOREIGN PATENT DOCUMENTS

| | | | | |
|---|---|---|---|---|
| JP | 2006-284316 | A | | 10/2006 |
| JP | 2006-327876 | A | | 12/2006 |
| JP | 2008-16691 | A | | 1/2008 |
| JP | 2008016691 | A | * | 1/2008 ........... H01L 21/324 |
| JP | 2008-230944 | A | | 10/2008 |
| JP | 2011-16703 | A | | 1/2011 |
| JP | 2011-247807 | A | | 12/2011 |
| WO | 2004/010075 | A1 | | 1/2004 |
| WO | 20111024854 | A1 | | 3/2011 |

OTHER PUBLICATIONS

International Preliminary Report on Patentability (Form PCT/IB/373) of International Application No. PCT/JP2011/006313 dated May 13, 2014, with Form PCT/ISA/237.
International Search Report of PCT/JP2011/006313, dated Dec. 27, 2011.
Y. Sano et al., "Fabrication Technology for Large-Scale Atomically Flat Surface", Journal of Japanese Society of Tribologists, Mar. 15, 2010, vol. 55, No. 3, pp. 148-153, cited in ISR and IPRP.
S. Ushio et al., "A study of temperature dependence of ridge structures formation during epitaxial graphene growth on 4H—SiC (000-1) C-face", The Japan Society of Applied Physics, Aug. 30, 2010, Extended Abstracts of the 71st Autumn Meeting, 16a-ZM-3, cited in ISR and IPRP.
H. Matsunami, "Silicon Carbide (SiC) Kenkyu no Shinten", FED Review, Apr. 2002, vol. 1, No. 17, 1-7, cited in ISR and IPRP.
A. Yoshii et al., "Step density dependence of epitaxial graphene on 4H—SiC(0001) surfaces characterized by spatially-resolved Raman spectroscopy", The Japan Society of Applied Physics and the Related Societies, Mar. 9, 2011, Extended Abstracts of 58th Spring Meeting, 26p-BM-12, cited in ISR.
Matsunami, "Progress in Research on Silicon Carbide", Mar. 14, 2002, FED Review, vol. 1, No. 17, pp. 1-8; with English abstract; cited in International Search Report and IPRP, and in Japanese Office Action.
Office Action from Japanese Patent Office dated May 28, 2015 in counterpart Japanese application No. 2013-542694 (4 pages).
Extended European Search Report dated Jun. 18, 2015, issued in counterpart European Patent Application No. 11875382.1 (7 pages); in English.
Vorburger, et al., "Calibration of 1 nm SiC step height standards", Metrology, Inspection, and Process Control for Microlithography XXIV, in Proceedings of the SPIE—The International Society for Optical Engineering, Feb. 22, 2010-Feb. 25, 2010, vol. 7638, pp. 76381D1-76381D13; cited in Extended European Search Report dated Jun. 18, 2015 (13 pages); in English.

* cited by examiner (a) LEVEL of probe is kept constant graph showing change in tunneling current (b) tunneling current is kept constant graph showing change in tunneling current (a)

(b)

(a) SiC substrate surface after mechanically polished (b) SiC substrate surface after vapor-etching planarization ※4H-SiC (c) SiC substrate surface after formation of steps having uniform terrace width ※4H-sic half-unit height situation of performing planarization (a) enlarged surface of standard sample that adopts Si substrate (b) schematic cross-section of standard sample that adopts Si substrate (a) enlarged surface of standard sample that adopts single crystal SiC substrate (b) enlarged cross-section of standard sample that adopts single crystal SiC substrate (c) schematic cross-section of steps and terraces of standard sample that adopts single crystal SiC substrate (a) SiC substrate after mechanically polished (doped with impurities)

Si face of SiC substrate

100

(b) SiC substrate surface after vapor-etching planarization

101

(c) SiC substrate surface after formation of steps having uniform terrace width

102

NANOMETER STANDARD PROTOTYPE AND METHOD FOR MANUFACTURING NANOMETER STANDARD PROTOTYPE

TECHNICAL FIELD

The present invention relates mainly to a nanometer standard prototype having a standard length that serves as a length reference.

BACKGROUND ART

Known as one example of the nanometer standard prototype is a standard sample for calibrating the accuracy of an atomic force microscope (AFM), a scanning tunneling microscope (STM), and the like. The AFM and the STM are used for, for example, measuring a structure of the order of nanometers. Therefore, a standard sample used for the calibration needs to have a standard length (such as the height of a step) with an extremely high accuracy. Particularly in recent years, it is demanded that a semiconductor crystal surface, or the like, be accurately observed and measured in a minute area of the order of nanometers. Thus, a high accuracy of calibration of the order of Angstroms or less is required when the AFM or the STM is calibrated by using a standard sample. Non-Patent Document 1 and Patent Documents 1 to 3 disclose this type of standard sample or a method for manufacturing the standard sample.

A standard sample disclosed in the Non-Patent Document 1 is a silicon step substrate having a single-step structure on a main surface thereof. It is manufactured such that the step has a height (0.31 nm) corresponding to two silicon atomic layers. The silicon step substrate having such a single-step structure on the main surface thereof is manufactured from a single crystal silicon substrate through the following method.

Firstly, a single crystal silicon substrate whose main surface includes a surface that is slightly inclined from a (111) plane toward the [11-2] direction is cut out into an appropriate size. Then, this substrate is subjected to a proper treatment, and then put into a vacuum chamber in which degassing is performed. After the degassing is performed sufficiently so that an ultrahigh vacuum atmosphere (about less than $6.5 \times 10^{-7}$ Pa) is produced, heating up to 1100 to 1200° C. is performed and this state is maintained for about 10 minutes. Then, rapid cooling down to room temperature is performed, and the vacuum chamber is purged with dry nitrogen. Under such a condition, the substrate is taken out. In this manner, a silicon step substrate having a single-step structure on a main surface thereof can be manufactured.

A standard sample disclosed in the Patent Document 1 is manufactured from a silicon wafer through the following method. The silicon wafer is smoothed sufficiently, and then a thermal oxide layer is grown. A pattern mask is made through a photolithography process, and then an etching process is performed. At this time, using an etching agent having an extremely low etching rate improves the accuracy of estimate of the etching rate, which enables the amount of etching to be set to a predetermined value. The pattern mask is removed, and thereby a pattern step with a high accuracy can be formed.

A standard sample disclosed in the Patent Document 2 is manufactured from a single crystal sapphire substrate including, in a main surface thereof, a surface with a (0001) plane or with a plane having an off angle of 10 degrees or less from a (0001) plane, through the following method. Appropriate polishing is performed on the single crystal sapphire substrate, and then a plurality of recesses are formed in the main surface of the substrate. The single crystal sapphire substrate having the recesses formed thereon is subjected to a heat treatment in the atmosphere. As a result, a step-terrace structure concentrically centered to the bottom of the recess is obtained. The height of one of the step is 0.22 nm. In the above-described manner, a sapphire substrate having steps with a high accuracy can be manufactured.

A method for manufacturing a standard sample disclosed in the Patent Document 3 is a method that enables the recesses, which are formed through the method disclosed in the Patent Document 2, to be formed accurately. In this method, an indenter made of a material harder than sapphire is pressed against a sapphire substrate, so that recesses are formed. The size and depth of the recess is adjustable in accordance with a load used to press the indenter.

PRIOR-ART DOCUMENTS

Patent Documents

Patent Document 1: Japanese Patent Application Laid-Open No. 1993-196559
Patent Document 2: Japanese Patent Application Laid-Open No. 2006-284316
Patent Document 3: Japanese Patent Application Laid-Open No. 2006-327876

Non-Patent Documents

Non-Patent Document 1: Japan Electronics and Information Technology Industries Association (JEITA) Standards "Height calibration in 1 nm order for AFM" pp. 3-5, July 2002

SUMMARY OF THE INVENTION

Problems to be Solved by the Invention

Meanwhile, calibration of the AFM using the standard sample is normally performed in the atmosphere. However, the standard samples disclosed in the Non-Patent Document 1 and the Patent Document 1 include silicon, and therefore an oxide film is generated on a surface thereof upon contact with the atmosphere. The oxide film generated on the surface reduces the accuracy of the height of the step. Thus, in the standard samples of the Non-Patent Document 1 and the Patent Document 1, the accuracy decreases over time. This is why a standard sample including silicon has an effective service lifetime of about six months, which is a very short lifetime. Additionally, it is impossible that a standard sample including silicon is regenerated as a standard sample after the effective service lifetime, because appropriately removing only an oxide film attached to a surface is difficult. Therefore, a standard sample that is able to maintain its accuracy for a long time when used in the atmosphere has been demanded.

Since the STM measures the shape of a sample based on a tunneling current flowing between a probe and a sample surface, it is essential that a standard sample for calibration the STM has conductive properties. Therefore, an oxide film provided on a surface of the standard sample, which can work as an insulating film, needs to be removed before the calibration of the STM is performed. This is why it is desirable that the oxide film of the standard sample is easy to remove.

In a case where a standard sample from which an oxide film is removed is arranged in a vacuum, a surface of the sample is unstable because nothing protects the standard sample. As a result, a situation occurs where, for example, atoms existing on the surface of the standard sample are bonded to cause a surface reconstruction, so that the state is shifted to a stable state. Occurrence of the surface reconstruction may sometimes result in a deterioration in the flatness of a terrace, depending on a material. The deterioration in the flatness of the terrace decreases the accuracy of the height of a step, which deteriorates the accuracy of the standard sample.

Under the above-described circumstances, it has been demanded that a standard sample for calibration of the STM is configured such that an oxide film is easy to remove and the flatness of a terrace can be maintained even when a surface reconstruction occurs.

The configurations disclosed in the Non-Patent Document 1 and the Patent Documents 1 to 3 have a limitation in the flatness of a terrace, and the calibration of the AFM, the STM, or the like, cannot be performed accurately. In this point as well, room for improvement is left.

Moreover, in a standard sample used for calibration of the height of the AFM, the STM, or the like, calibration heights that are currently commercially available include the smallest value, mainly 0.31 nm mentioned above, 8.0 nm in a case of a quartz sample, and the like. However, a standard sample that is able to provide a calibration value in the range therebetween (0.31 to 8.0 nm) has not existed. For correctly evaluating an object by using the AFM, it is necessary to measure a standard sample in at least two points with different values and thereby examine linear characteristics of an evaluation apparatus relative to the measured values. Accordingly, in order to measure a height difference of the order of nanometers, a standard sample that is able to provide a plurality of absolute values in the range from 0.31 nm to 8.0 nm with sufficient reliability has been demanded.

The present invention has been made in view of the circumstances described above, and a primary object of the present invention is to provide a nanometer standard prototype that is usable in the atmosphere or in a vacuum and that is able to calibrate a measuring instrument with a high accuracy.

Means for Solving the Problems and Effects Thereof

Problems to be solved by the present invention are as described above, and next, means for solving the problems and effects thereof will be described.

In a first aspect of the present invention, a nanometer standard prototype having the following configuration is provided. The nanometer standard prototype has a standard length that serves as a length reference. The nanometer standard prototype comprises a substrate that includes a single crystal SiC layer in which a step-terrace structure is formed. The height of a step formed in the SiC layer is equal to the height of a full unit that corresponds to one periodic of a stack of single crystal SiC molecules in a stack direction or equal to the height of a half unit that corresponds to one-half periodic of the stack of single crystal SiC molecules in the stack direction. The height of the step is used as the standard length.

Since SiC is used as a material, a nanometer standard prototype having an excellent heat resistance is achieved. Besides, since SiC is less likely to react with a substance contained in the atmosphere, a nanometer standard prototype that is able to maintain the accuracy of the height of the step for a long time is achieved.

The nanometer standard prototype is preferably configured as follows. Firstly, an off angle is formed on a (0001) Si face or a (000-1) C face of the SiC layer of 4H or 6H polytype. Then, a heat treatment is performed on the substrate under Si vapor pressure in a temperature range of 1500° C. or more 2300° C. or less, to cause a surface of the substrate to be vapor-etched and planarized to a molecular level and to form a step corresponding to a full unit or half-unit cell height of a single crystal SiC molecular periodic arrangement so that a step-terrace structure that is in conformity with the off angle is formed in the surface of the substrate.

Since a surface of a terrace is planarized to the molecular level, a nanometer standard prototype having a standard length with a high accuracy is achieved.

In the nanometer standard prototype, it is preferable that the heat treatment for the formation of the step-terrace structure is performed in a container made of tantalum metal and including a tantalum carbide layer that is exposed in an internal space of the container.

This enables the container to exert a carbon getter function, and a high-purity Si atmosphere can be kept in the container. Accordingly, the heat treatment can be performed in a suitable environment.

In the nanometer standard prototype, it is preferable that the SiC layer is made of 4H—SiC single crystal or 6H—SiC single crystal.

Accordingly, four kinds of heights are obtained in accordance with a required standard length. The four kinds of heights are the height of a full unit of 4H—SiC single crystal, the height of a half unit of 4H—SiC single crystal, the height of a full unit of 6H—SiC single crystal, and the height of a half unit of 6H—SiC single crystal. This provides flexible adaptation to a variety of applications.

In the nanometer standard prototype, it is preferable that adjusting an off angle of a surface in which the step-terrace structure is formed allows formation of a terrace having any terrace width.

Accordingly, a nanometer standard prototype having a required terrace width can be manufactured. In a case of calibrating a measuring instrument by using the nanometer standard prototype, increasing the terrace width can result in a relatively less influence of fine unevenness of a terrace surface. Thus, the calibration can be performed more correctly.

The nanometer standard prototype is preferably configured as follows. The surface of the substrate included in the nanometer standard prototype is a (0001) Si face of the SiC layer of 4H or 6H polytype. A heat treatment is performed on the substrate under Si vapor pressure in a temperature range of 1500° C. or more 2300° C. or less, to cause the surface of the substrate to be vapor-etched and planarized to a molecular level and to form a step-terrace structure in the substrate. Each terrace has a surface configuration in which a ($\sqrt{3}\times\sqrt{3}$)–30° pattern or a ($6\sqrt{3}\times6\sqrt{3}$)–30° pattern including a single crystal SiC molecular arrangement structure is formed.

The surface configuration formed in the substrate has a periodical pattern. Therefore, in the nanometer standard prototype of the present invention, in a case of, for example, measuring a sample in a high-temperature vacuum environment by using a microscope, no influence is given on the surface flatness of the substrate even though a natural oxide film is removed from the surface of the SiC layer and a reconstruction of the single crystal SiC molecule surface occurs. Accordingly, a nanometer standard prototype that is able to provide a standard length with a high accuracy even in a high-temperature vacuum is achieved. Additionally, the step-terrace structure is formed in a Si-surface. Therefore, even when a natural oxide film is formed on the Si-surface, the step-terrace structure can be maintained while the natural oxide film is successfully removed. Thus, the reconstruction of the single crystal SiC molecule surface can be caused.

The nanometer standard prototype is preferably configured as follows. Even when the substrate is maintained in the atmosphere so that a natural oxide film is formed on a surface of the SiC layer, heating the substrate in a vacuum state in a temperature range of 800° C. or more and 1400° C. or less causes the natural oxide film to be removed from the surface of the SiC layer and causes a reconstruction of the single crystal SiC molecular arrangement formed on the surface of the SiC layer to occur so that the surface is reconstructed to have a ($\sqrt{3}\times\sqrt{3}$)–30° pattern or a ($\sqrt{6}\sqrt{3}\times 6\sqrt{3}$)–30° pattern.

Accordingly, even when the substrate is maintained in the atmosphere for a long time so that a natural oxide film is formed on the surface, performing the heat treatment in the above-described manner achieves a surface reconstruction with detachment of the natural oxide film. Therefore, an increased lifetime of the nanometer standard prototype is achieved.

In the nanometer standard prototype, it is preferable that a predetermined off angle is provided on the (0001) Si face that is the surface of the substrate before planarization of the SiC layer, so that a step-terrace structure is formed in the surface of the substrate at a time of planarization of the SiC layer.

Accordingly, making the nanometer standard prototype by using an off-substrate can ensure the formation of the step-terrace structure.

In the nanometer standard prototype, it is preferable that the substrate is a conductive substrate given a resistivity of 0.3 Ωcm or less by doping of an impurity.

Since conductive properties are given to the substrate, the nanometer standard prototype can be used for calibration of a measuring instrument that detects the shape of a sample by using a tunneling current. Since the oxide film formed on the surface of the substrate is successfully removed as described above, a deterioration in the conductive properties of the substrate can be prevented.

In the nanometer standard prototype, it is preferable that the step-terrace structure is formed in both a Si-surface and a C-surface of the substrate.

Accordingly, it is possible that for example, an Si-surface is used for an STM or the like that is to be measured in a high-temperature vacuum environment while a C-surface is used for an AFM or the like that is to be measured in a normal-temperature atmospheric pressure environment. Therefore, a multifunction nanometer standard prototype that is flexibly adaptable to different measurement environments is achieved.

It is preferable that the nanometer standard prototype is used as a standard sample for calibration of a measuring instrument.

Accordingly, a standard sample that is able to calibrate a measuring instrument (for example, an AFM and an STM) is achieved.

A second aspect of the present invention provides a method for manufacturing a nanometer standard prototype configured such that a step-terrace structure is formed on a substrate whose surface includes a single crystal SiC layer, the height of a step is equal to the height of a full unit that corresponds to one full unit of a stack of single crystal SiC molecules in a stack direction or equal to the height of a half unit that corresponds to half-unit length of the stack of single crystal SiC molecules in the stack direction, and the height of the step is used as a standard length. The method for manufacturing the nanometer standard prototype includes an off-angle providing step and a step-terrace structure formation step. In the off-angle providing step, an off angle is provided on a (0001) Si face or a (000-1) C face of a substrate surface of the SiC layer of 4H or 6H polytype. In the step-terrace structure formation step, a step-terrace structure that is in conformity with the off angle is formed in the surface of the substrate by performing a heat treatment on the substrate under Si vapor pressure in a temperature range of 1500° C. or more 2300° C. or less, to cause the surface of the substrate to be vapor-etched and planarized to a molecular level and to form a step corresponding to full unit or half-unit length of a single crystal SiC molecular arrangement periodic.

Since SiC is used as a material, a nanometer standard prototype having an excellent heat resistance is achieved. Besides, since SiC has characteristics of being less likely to react with a substance contained in the atmosphere, a nanometer standard prototype that is able to maintain the accuracy of the height of the step for a long time is achieved.

A third aspect of the present invention provides a method for manufacturing a nanometer standard prototype configured such that a step-terrace structure is formed on a substrate whose surface includes a single crystal SiC layer, the height of a step is equal to the height of a full unit that corresponds to one periodic of a stack of single crystal SiC molecules in a stack direction or equal to the height of a half unit that corresponds to half-unit length of the stack of single crystal SiC molecules in the stack direction, and the height of the step is used as a standard length. The method for manufacturing the nanometer standard prototype includes an off-angle providing step, a step-terrace structure formation step, and a surface reconstruction formation step. In the off-angle providing step, an off angle is provided on a (0001) Si face that is the surface of the substrate. In the step-terrace structure formation step, a step-terrace structure that is in conformity with the off angle is formed in the surface of the substrate by performing a heat treatment on the substrate under Si vapor pressure in a temperature range of 1500° C. or more 2300° C. or less, to cause the surface of the substrate to be vapor-etched and planarized to a molecular level and to form a step corresponding to one periodic or one-half periodic of a single crystal SiC molecular arrangement. At this time, a surface configuration having a ($\sqrt{3}\times\sqrt{3}$)–30° pattern or a ($6\sqrt{3}\times 6\sqrt{3}$)–30° pattern including a single crystal SiC molecular arrangement structure is formed in each terrace. Even when the substrate is maintained in the atmosphere so that a natural oxide film is formed on a surface of the SiC layer, heating the substrate in a vacuum state in a temperature range of 800° C. or more and 1400° C. or less causes the natural oxide film to be removed from the surface of the SiC layer and causes a reconstruction of the single crystal SiC molecular arrangement formed on the surface of the SiC layer to occur so that a ($\sqrt{3}\times\sqrt{3}$)–30° pattern or a ($6\sqrt{3}\times 6\sqrt{3}$)–30° pattern is formed.

Accordingly, even when the substrate is maintained in the atmosphere for a long time so that a natural oxide film is formed on the surface, performing the heat treatment in the above-described manner achieves a surface reconstruction with detachment of the natural oxide film. Therefore, an increased lifetime of the nanometer standard prototype is achieved.

In the method for manufacturing the nanometer standard prototype, it is preferable that the nanometer standard prototype is used as a standard sample for calibration of a measuring instrument.

Accordingly, a standard sample that is able to calibrate a measuring instrument (for example, an AFM and an STM) is achieved.

(a) A schematic cross-sectional view of a substrate in which a surface of a single crystal SiC substrate is mechanically polished to have a predetermined off angle.

(b) A schematic cross-sectional view in which the surface of the substrate is planarized to a molecular level by vapor etching.

(c) A schematic cross-sectional view showing a step-terrace structure that is formed in conformity with the off angle of the surface of the substrate.

Figure 9:
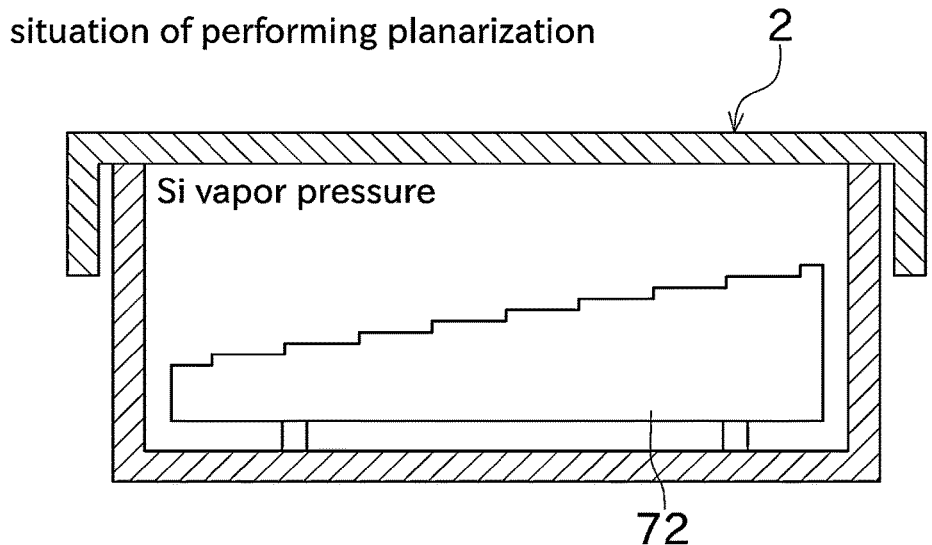

FIG. 9 A schematic view showing a situation where the single crystal SiC substrate is heated.

Figure 10:
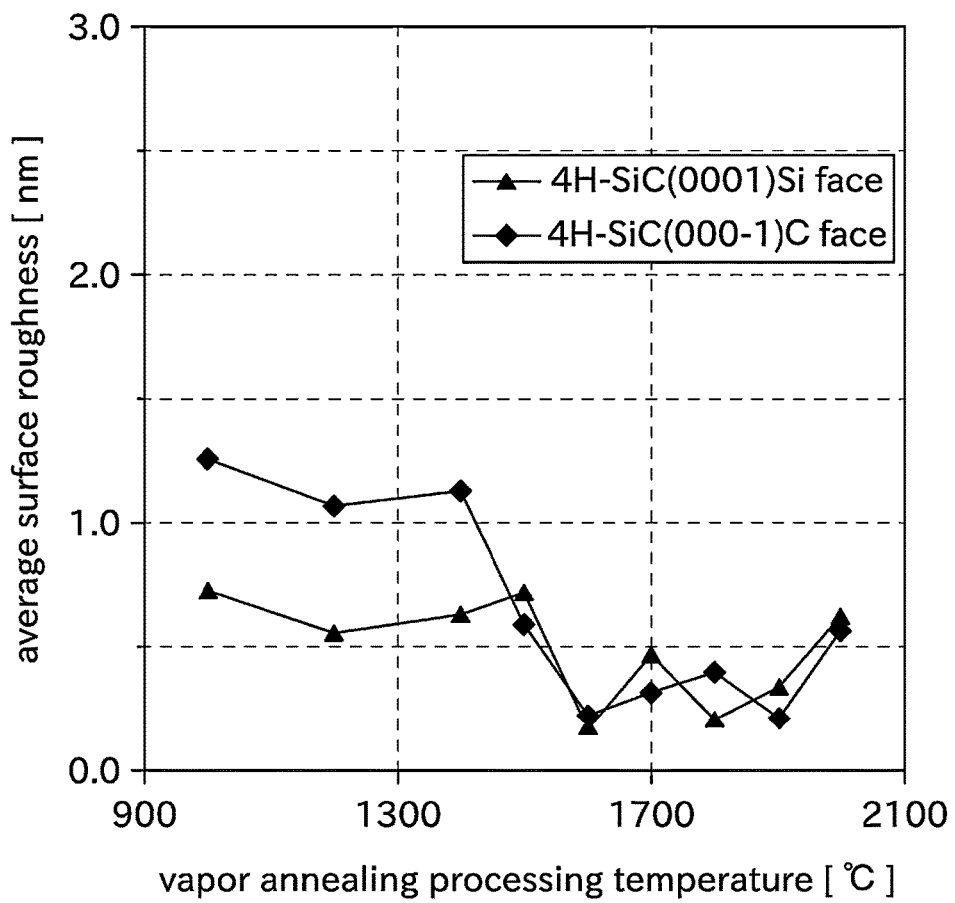

FIG. 10 A graph showing the relationship between the surface roughness of a substrate and the processing temperature in a process for planarizing a surface of the substrate in the vapor annealing step, with respect to a (0001) plane and a (000-1) just plane of a single crystal SiC substrate that is mechanically polished.

Figure 11:
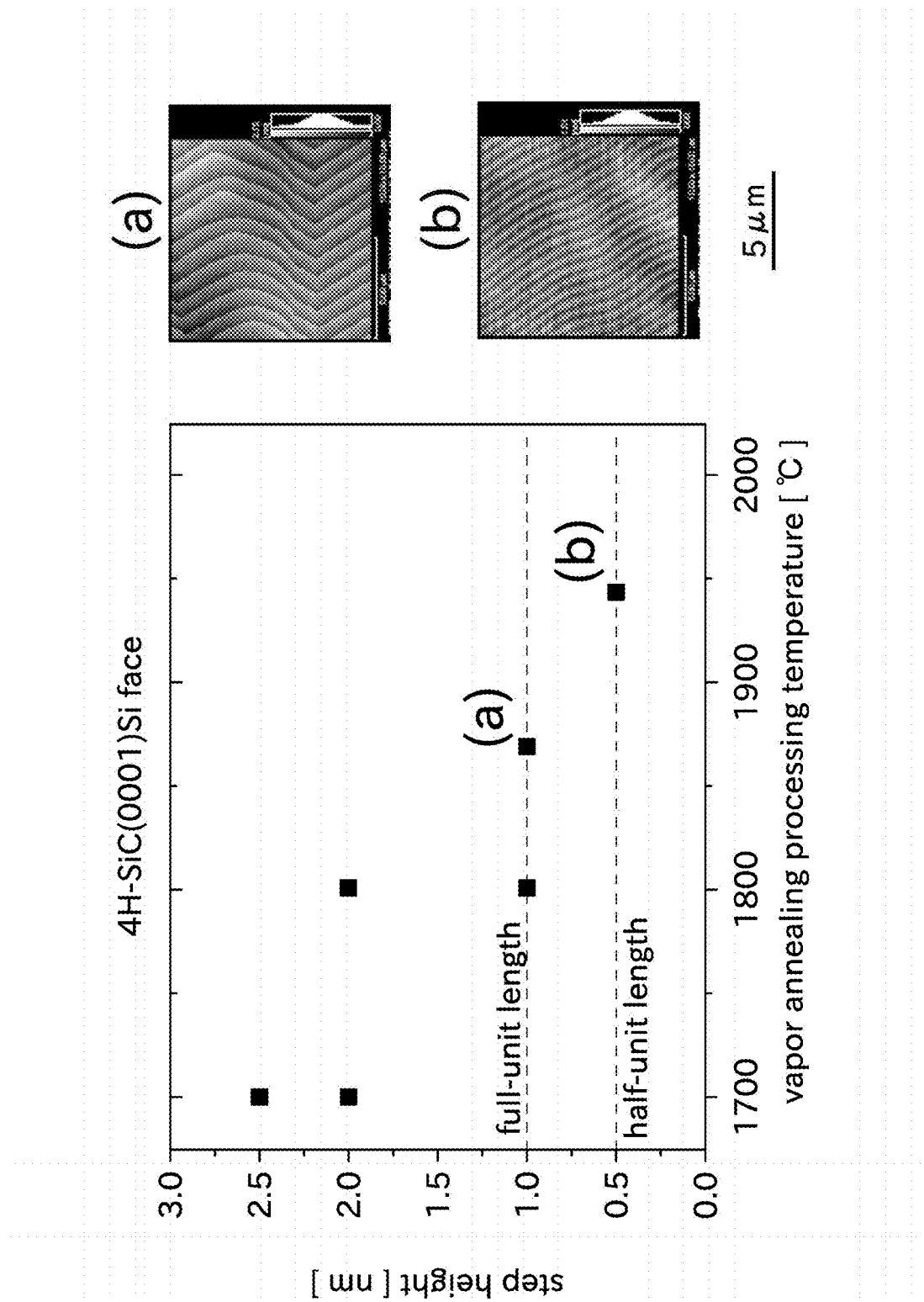

FIG. 11 A measured example of the height of a step corresponding to full unit and half-unit length of a SiC molecular arrangement periodic, which is obtained through a vapor annealing process performed on a (0001) Si face of a single crystal SiC substrate; and an example of an AFM magnified photograph of the surface.

Figure 12:
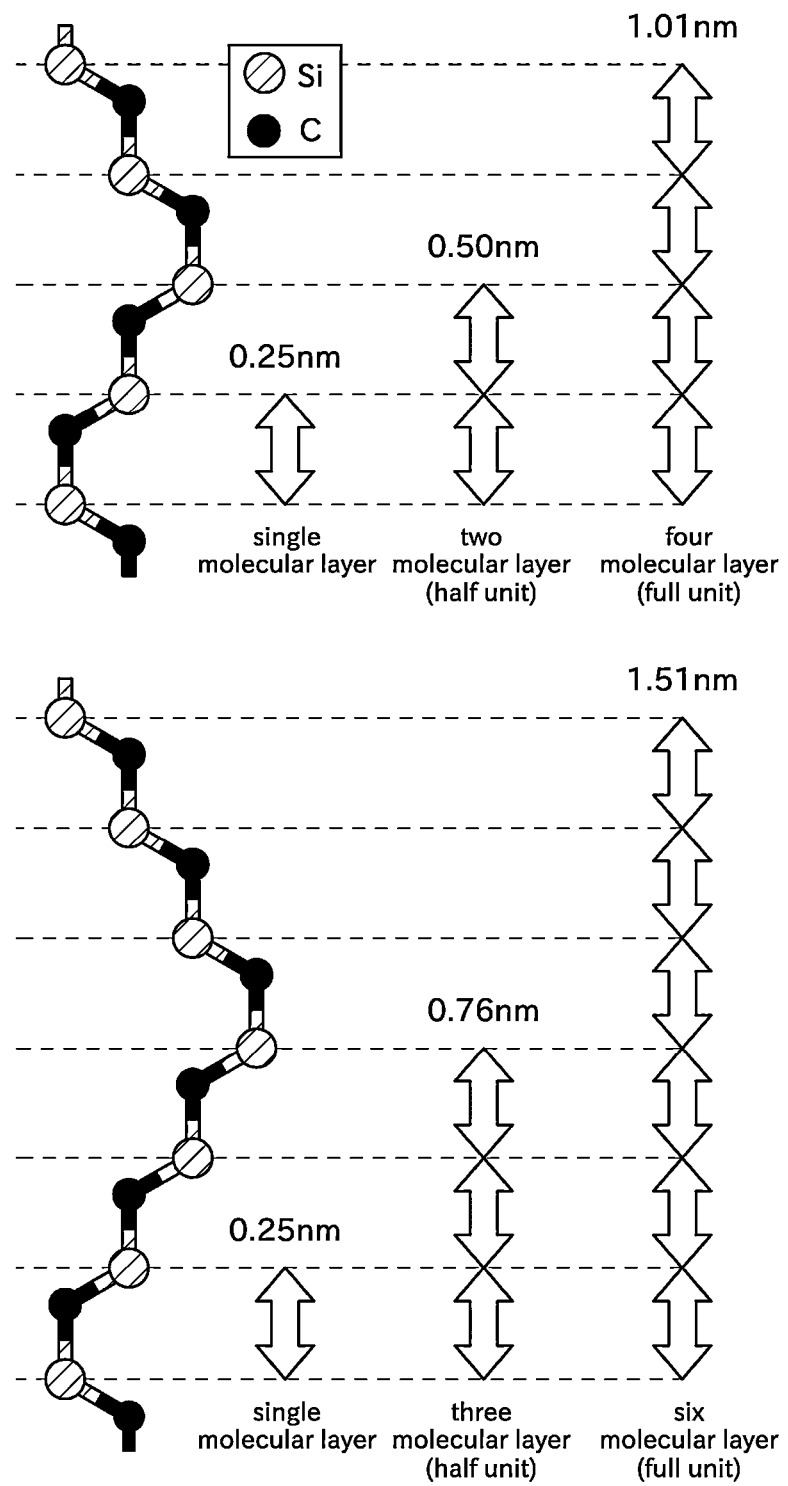

FIG. 12 A schematic view showing molecular arrangements periodic of 4H—SiC single crystal and 6H—SiC.

Figure 13:
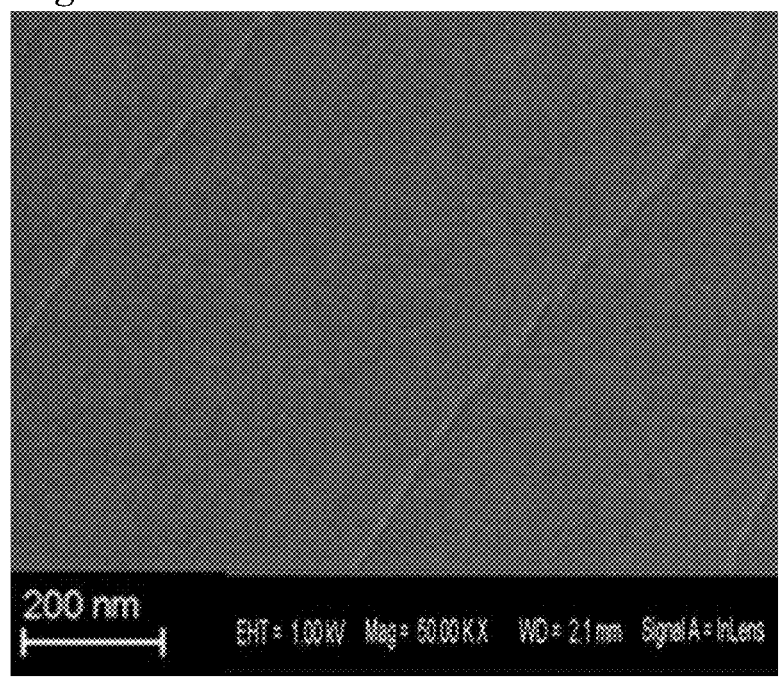

FIG. 13 An example of an electron-microscope magnified photograph of a surface of a terrace in which a step corresponding to full unit of a SiC molecular arrangement periodic is formed through a vapor annealing process performed on a (0001) Si face of a single crystal SiC substrate.

Figure 14:
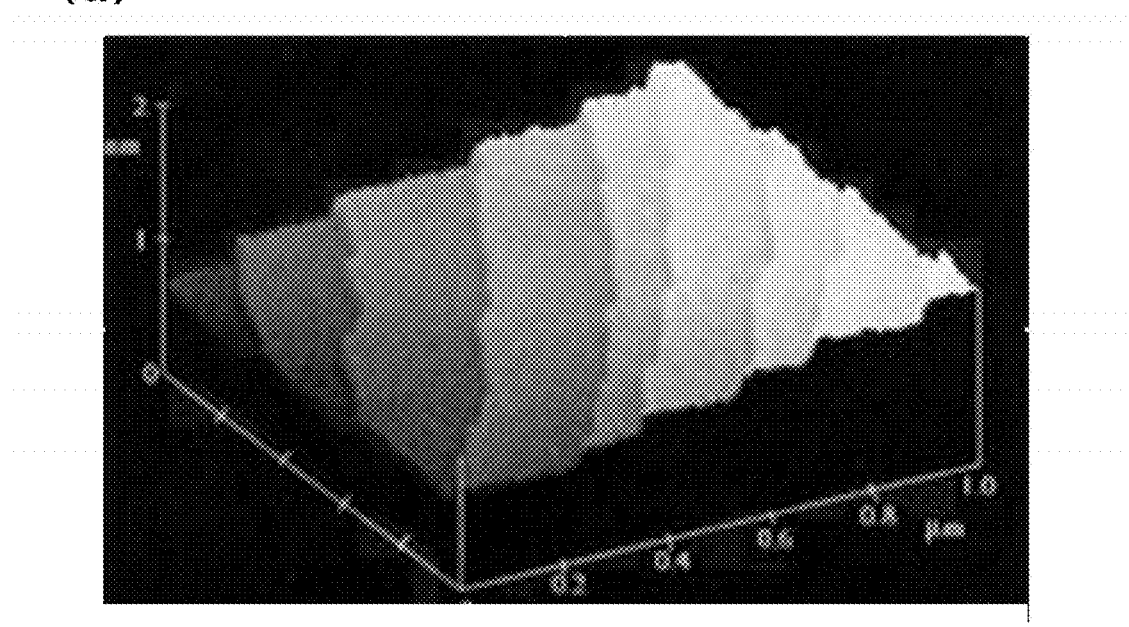
Figure 14:
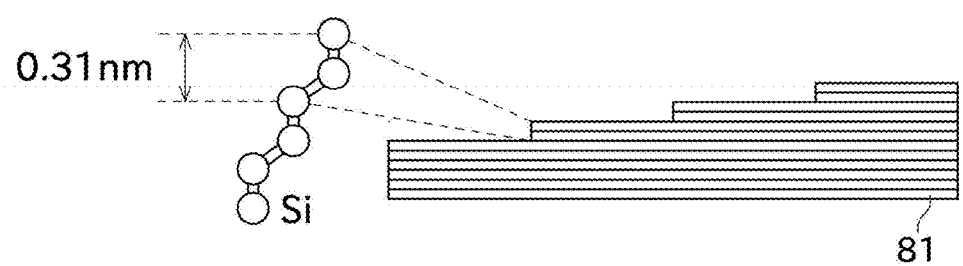

FIG. 14 A diagram showing, on an enlarged scale, a standard sample that adopts a Si substrate of the conventional technique.

(a) A diagram showing, on an enlarged scale, a surface of a standard sample that adopts a Si substrate.

(b) A schematic cross-sectional view of the standard sample that adopts the Si substrate.

Figure 15:
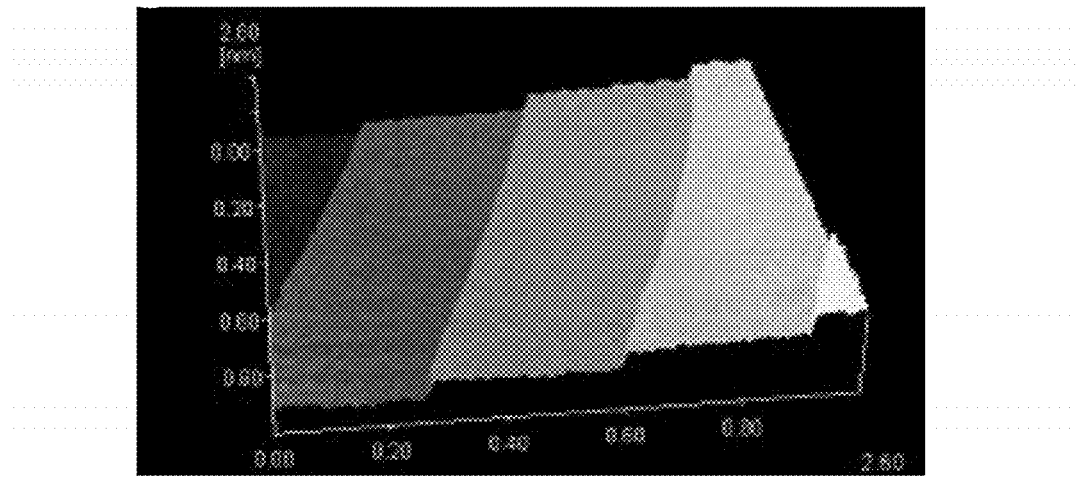
Figure 15:
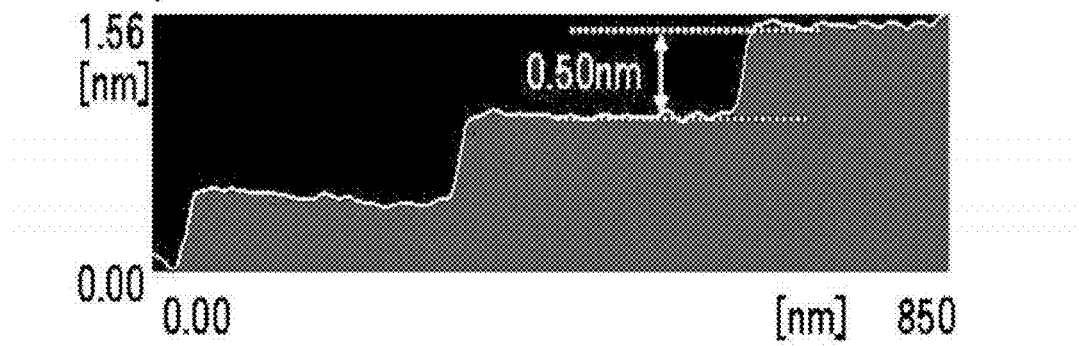
Figure 15:
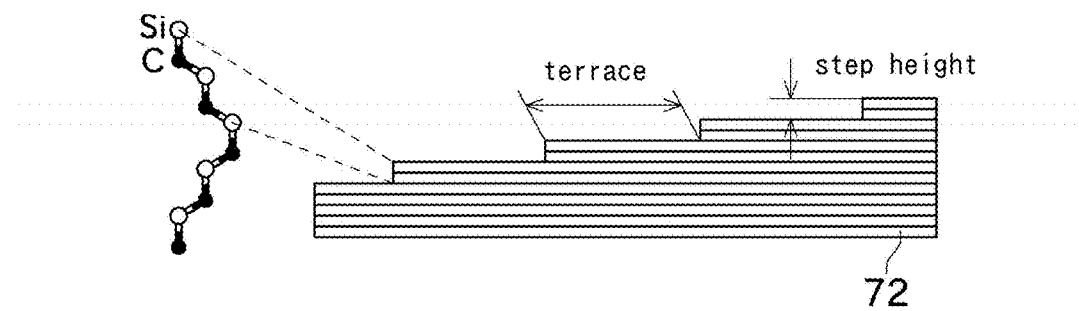

FIG. 15 A diagram showing, on an enlarged scale, a nanometer standard prototype that adopts a single crystal SiC substrate.

(a) A diagram showing, on an enlarged scale, a surface of a standard sample that adopts a single crystal SiC substrate.

(b) A cross-section view showing, on an enlarged scale, the standard sample that adopts the single crystal SiC substrate.

(c) A schematic cross-sectional view of steps and terraces of the standard sample that adopts the single crystal SiC substrate.

Figure 16:
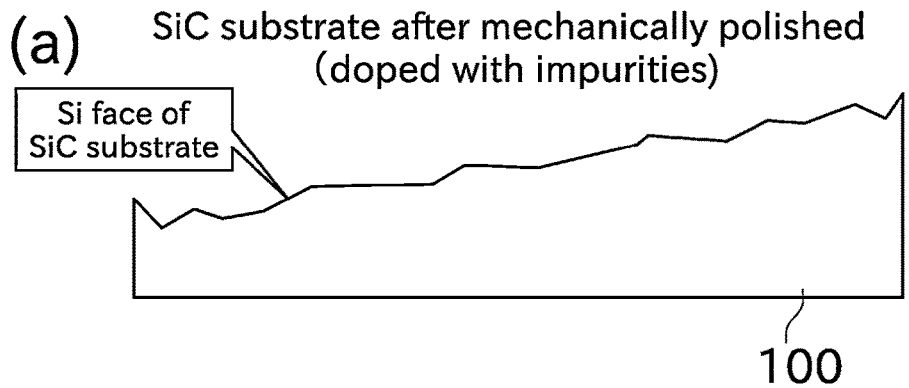
Figure 16:
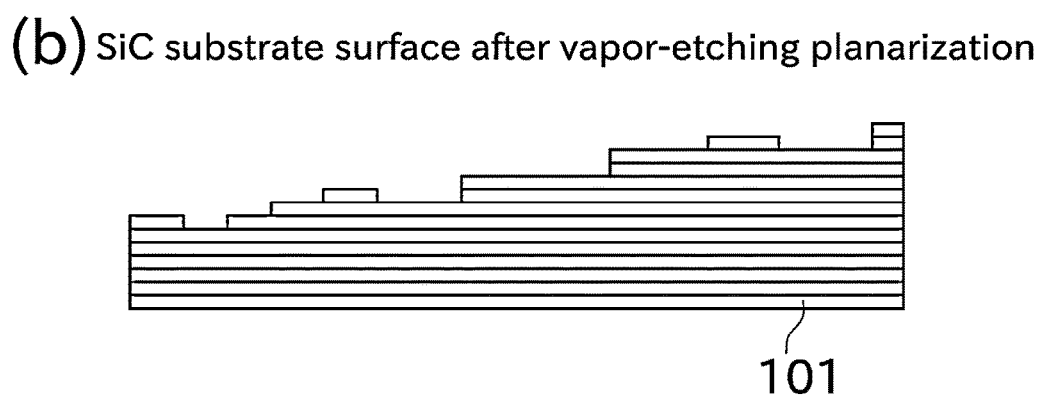
Figure 16:
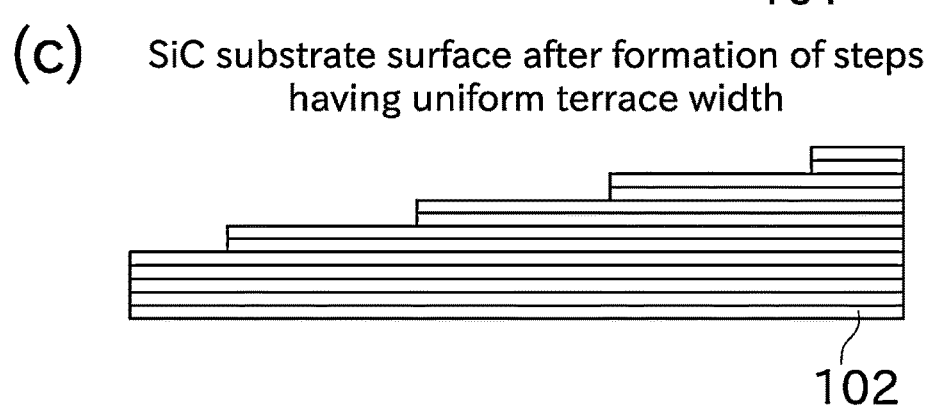

FIG. 16 A conceptual diagram showing a process for manufacturing a standard sample for calibration of an STM.

(a) A schematic cross-sectional view of a substrate in which a surface of a single crystal SiC substrate is mechanically polished to have a predetermined off angle.

(b) A schematic cross-sectional view in which the surface of the substrate is planarized to a molecular level by vapor etching.

(c) A schematic cross-sectional view showing a step-terrace structure that is formed in conformity with the off angle of the surface of the substrate.

Figure 17:
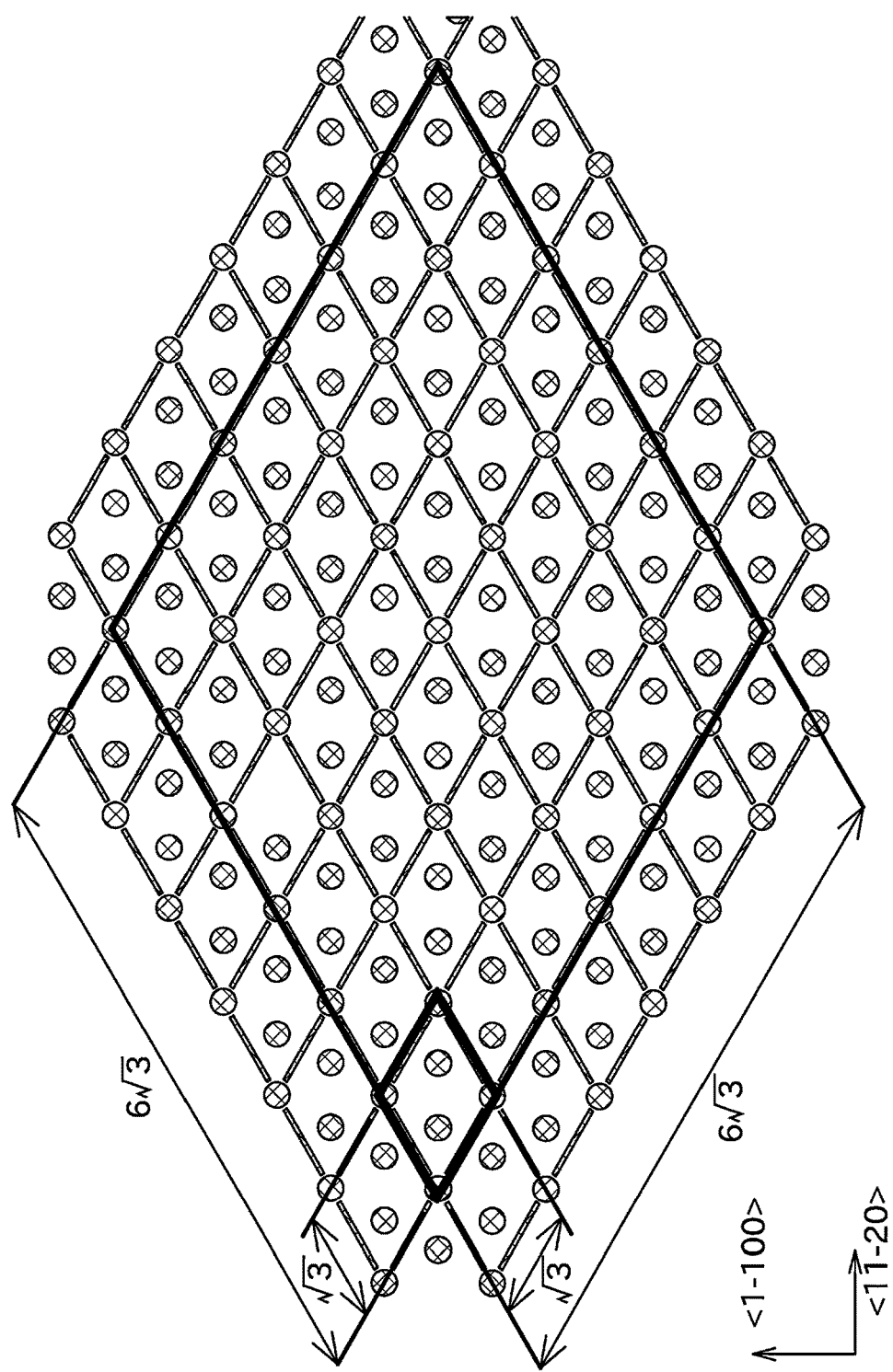

FIG. 17 A schematic plan view conceptually showing a $(\sqrt{3}\times\sqrt{3})$–30° pattern or a $(6\sqrt{3}\times6\sqrt{3})$–30° pattern of a SiC crystal lattice.

Figure 18:
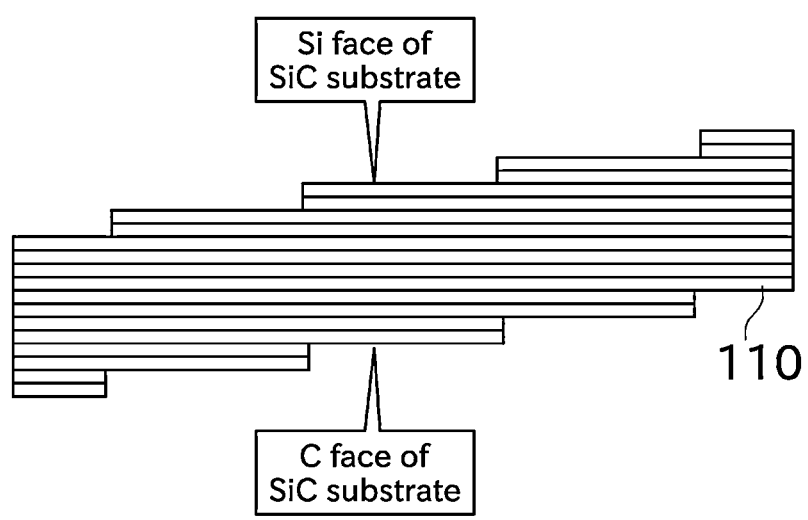

FIG. 18 A schematic cross-sectional view showing step-terrace structures that are formed in both a Si-surface and a C-surface of a substrate.

EMBODIMENT FOR CARRYING OUT THE INVENTION

Next, an embodiment of the present invention will be described with reference to the drawings.

Figure 1:
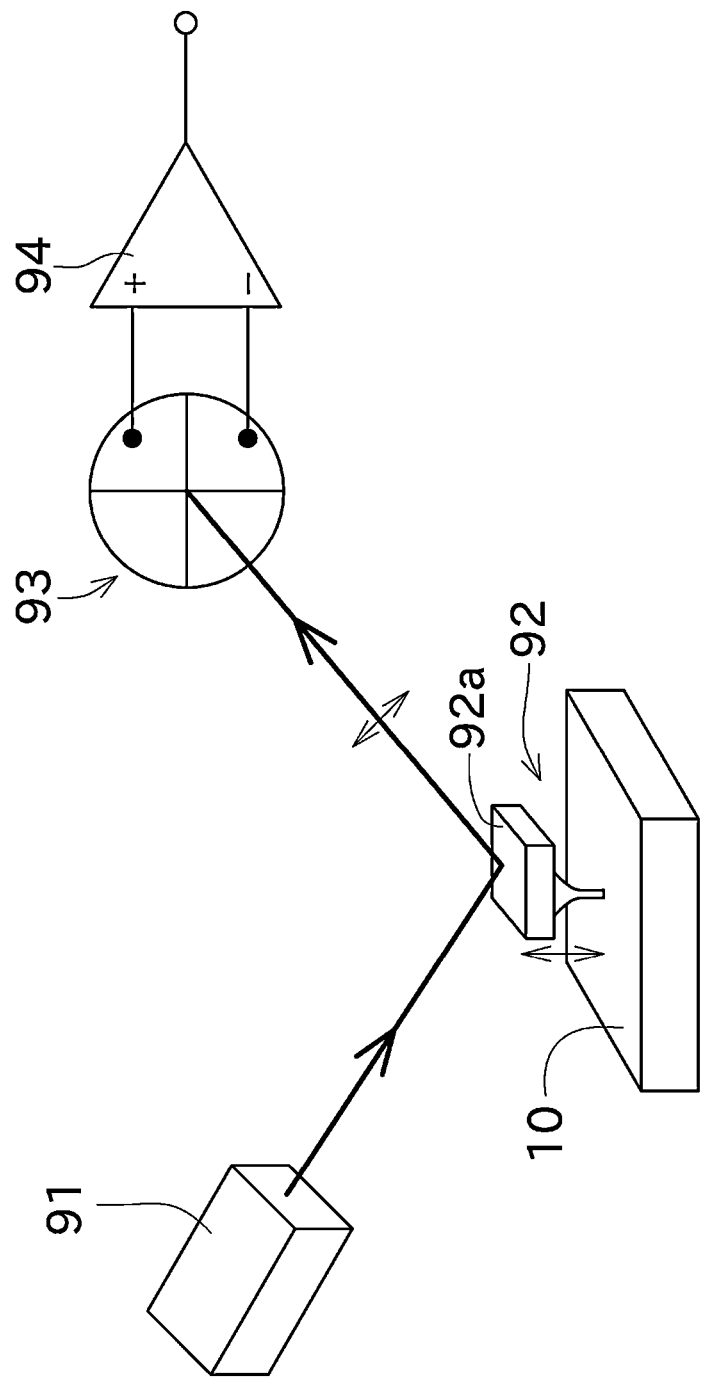
FIG. 1 An explanatory diagram showing outline of the measurement principle of an AFM.

The measurement principles of an atomic force microscope (AFM; measuring instrument) and a scanning tunneling microscope (STM; measuring instrument) will be described. Firstly, the measurement principle of an AFM will be described with reference to FIG. 1. FIG. 1 is an explanatory diagram showing outline of the measurement principle of an AFM.

The AFM is an apparatus that detects the shape of a surface of a sample 10 based on an atomic force between a cantilever 92 (probe) and a detection object that is the sample 10, as shown in FIG. 1. In more detail, the cantilever 92 includes a reflecting surface 92a that is able to reflect light. A laser generator 91 provided in the AFM emits a laser beam to the reflecting surface 92a. The laser beam reflected by the reflecting surface 92a is measured by a four-split photodiode 93. Photovoltaic power occurring in each region of the photodiode 93 is amplified by an amplifier 94, and transmitted to a proper signal processing apparatus.

In this configuration, when the cantilever 92 approaches the sample 10, an atomic force between the cantilever 92 and the sample 10 attracts the cantilever 92 to the sample 10, to deform the cantilever 92. The deformation changes the direction in which the laser beam reflected by the reflecting surface 92a travels, which causes a difference in the photovoltaic power among the regions of the photodiode 93. The cantilever 92 is moved on the surface of the sample 10 while being moved up and down so as to eliminate this difference in the photovoltaic power (so as to make constant the amount of deformation of the cantilever 92). The shape of the surface of the sample 10 can be detected based on a position on the sample 10 at which the cantilever 92 is moved up and down and the amount of the movement.

Figure 2:
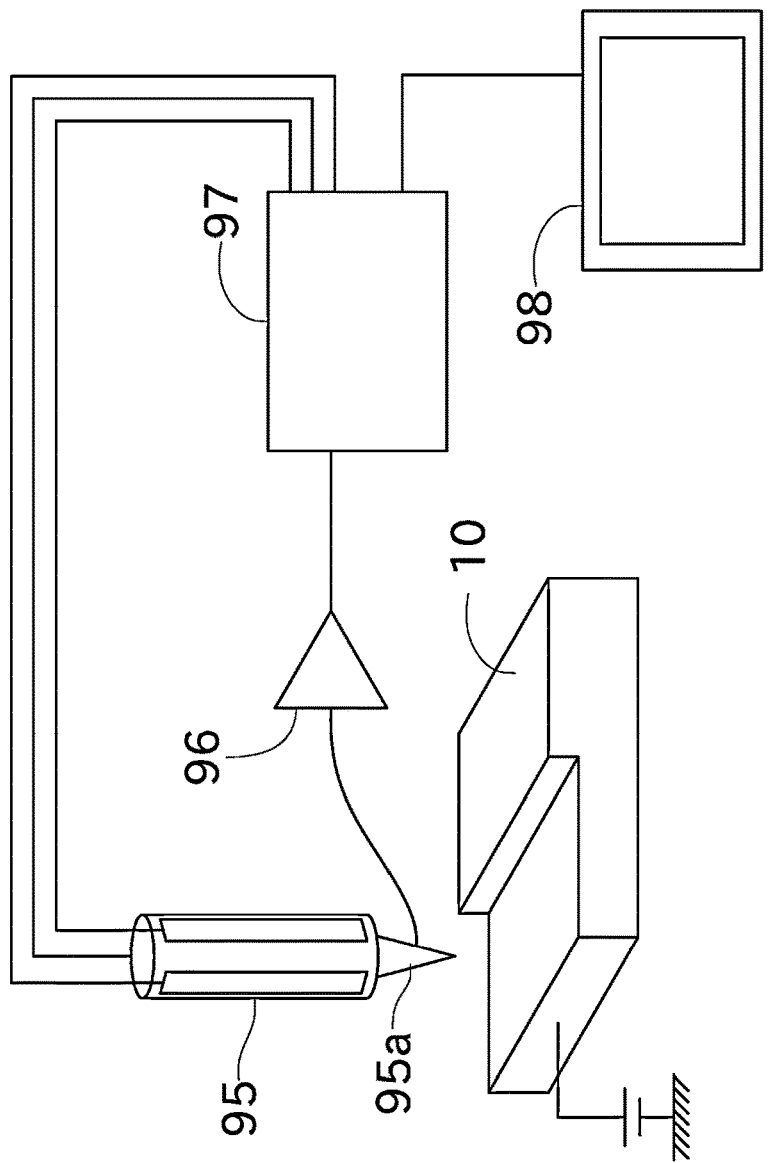
FIG. 2 An explanatory diagram showing outline of the measurement principle of an STM.

Next, a brief description will be given of the measurement principle of an STM with reference to FIG. 2. FIG. 2 is an explanatory diagram showing outline of the measurement principle of an STM. The STM is an apparatus that detects the shape of a surface of a sample by using a tunneling current occurring between a probe and the sample. Therefore, the STM is able to measure only a sample having conductive properties.

As shown in FIG. 2, the STM includes, in its main configuration, a scanning unit 95, a current amplification unit 96, a control unit 97, and a display unit 98.

The control unit 97 applies a voltage to the scanning unit 95. A piezoelectric effect exerted by the voltage applied from the control unit 97 enables the scanning unit 95 to move in a direction toward the sample 10 and a direction (height direction) away from the sample 10. The scanning unit 95 can be moved in a direction along a surface of the sample 10 by a proper driving part. A probe 95a is provided at the distal end of the scanning unit 95. The probe 95a is brought closer to the sample 10 to the atomic level, which causes a tunneling current to flow between the probe 95a and the sample 10. The tunneling current is amplified by the current amplification unit 96, and then inputted to the control unit 97.

The control unit 97 is able to control the position of the scanning unit 95 with respect to the height direction by changing the voltage applied to the scanning unit 95. It is known that the value of the tunneling current increases as the probe 95a gets closer to the sample 10. Therefore, the control unit 97 is able to detect the shape of the surface of the sample 10 based on the relationship between the voltage applied to the scanning unit 95 and the magnitude of the tunneling current. More specifically, the control unit 97 detects the shape of the surface of the sample 10 through either of the following two methods.

Figure 3:
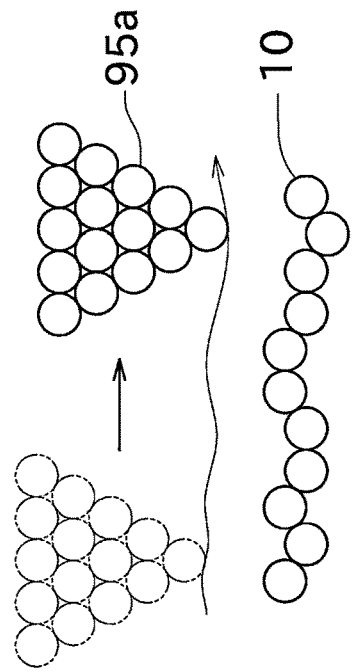
FIG. 3 An explanatory diagram showing two kinds of measuring methods of an STM.
Figure 3:
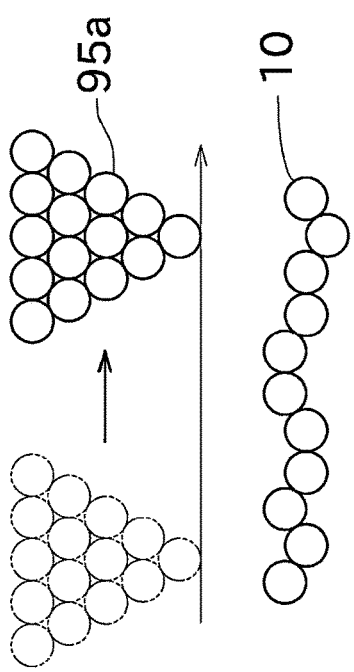

One of the methods is a method in which the level of the probe 95a is kept constant as shown in FIG. 3(a). In this method, the flowing tunneling current changes in accordance with unevenness of the sample 10. The control unit 97 is able to detect the shape of the surface of the sample 10 based on a change in the tunneling current.

The other of the methods is a method in which the flowing tunneling current is kept constant as shown in FIG. 3(b). In this method, the control unit 97 adjusts the voltage applied to the scanning unit 95 so as to keep the flowing tunneling current constant. The control unit 97 is able to detect the shape of the surface of the sample 10 based on the voltage applied to the scanning unit 95.

In a case of measurement using the STM, the measurement is generally performed under a state where an atmosphere around the sample 10 is vacuumed. Performing the measurement in a vacuum enables measurement of a surface of the sample itself because the sample 10 cannot react with any gas molecule. Particularly, the sample 10 is easy to react with a gas molecule in a high temperature atmosphere, and therefore the surface of the sample 10 cannot be appropriately measured unless an atmosphere around the sample 10 is vacuumed.

In the AFM and the STM, calibration is sometimes performed every fixed time period in order that the shape of the surface of the sample can be detected accurately. The calibration is performed with use of a standard sample in which steps having a predetermined height are formed, as shown in FIGS. 14 and 15.

In an operation of the calibration, a position where a step of the standard sample is formed is firstly recognized, and then a surface of a terrace thereof is measured by using the AFM or the STM. Then, image processing is performed so as to level the surface of the terrace measured. Since terraces are normally parallel to one another, leveling a surface of one terrace enables measurement to be performed under a state where surfaces of all terraces are leveled. Then, a terrace adjacent to the measured terrace is measured. At this time, the calibration can be made by setting the AFM or the STM such that the height measured based on this AFM or the STM is coincident with the standard length of the standard sample (in a case of a silicon step substrate, 0.31 nm). It may be possible to further measure standard samples having different standard lengths and thereby examine linear characteristics of the AFM or the STM relative to measured values.

Figure 4:
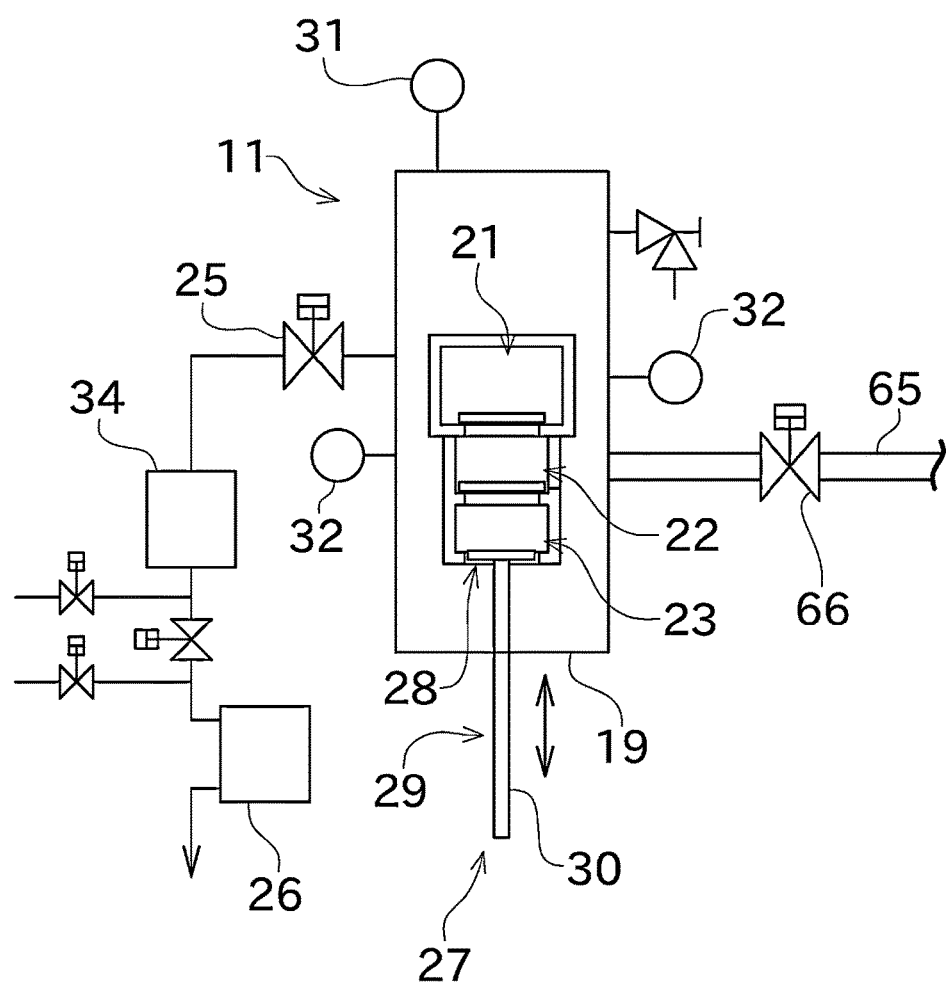
FIG. 4 A schematic view showing a high-temperature vacuum furnace for use in a heat treatment for manufacturing a standard sample.
Figure 5:
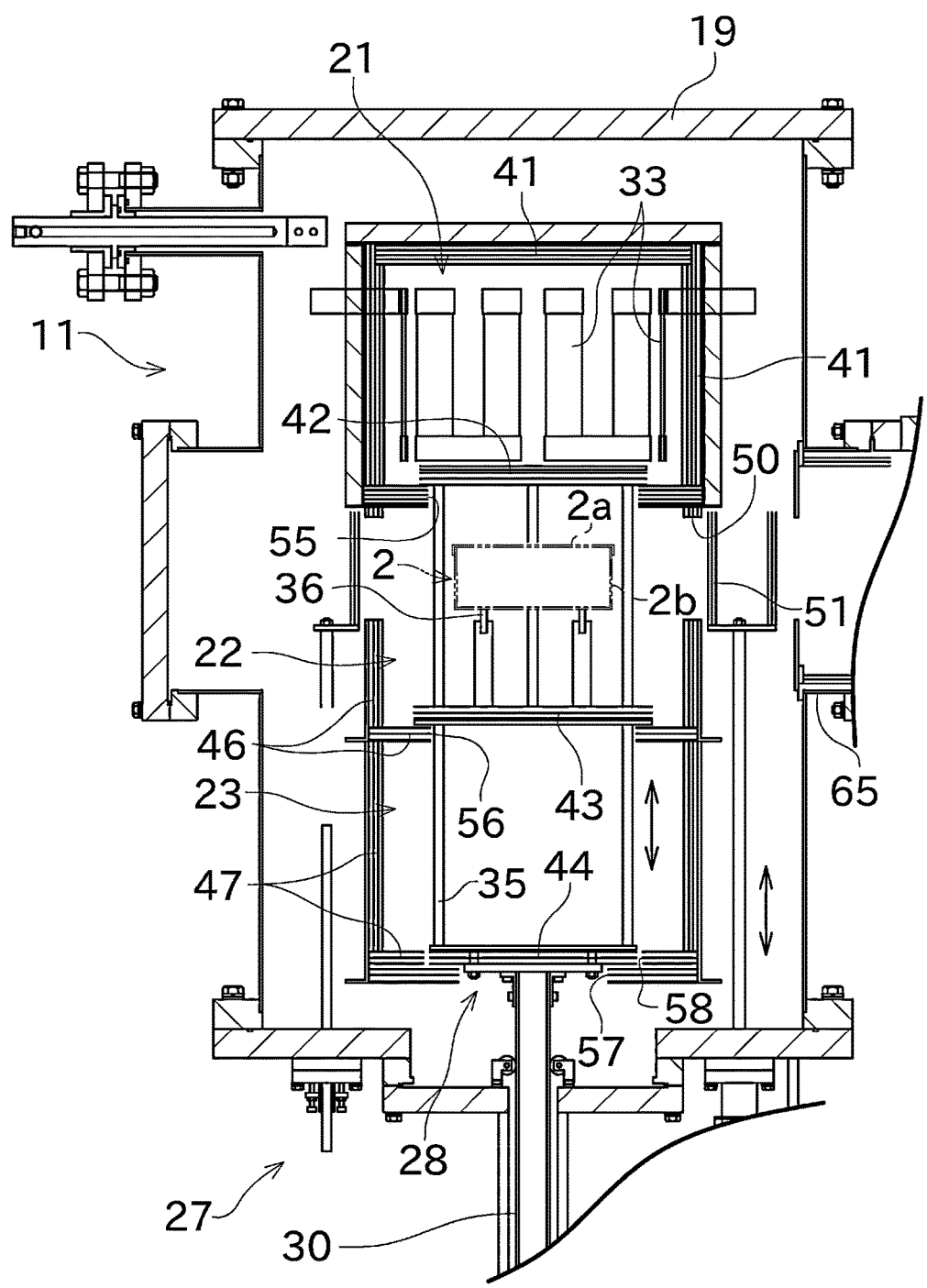
FIG. 5 A diagram of a cross-sectional structure showing details of a main heating chamber and a preheating chamber of the high-temperature vacuum furnace.
Figure 6:
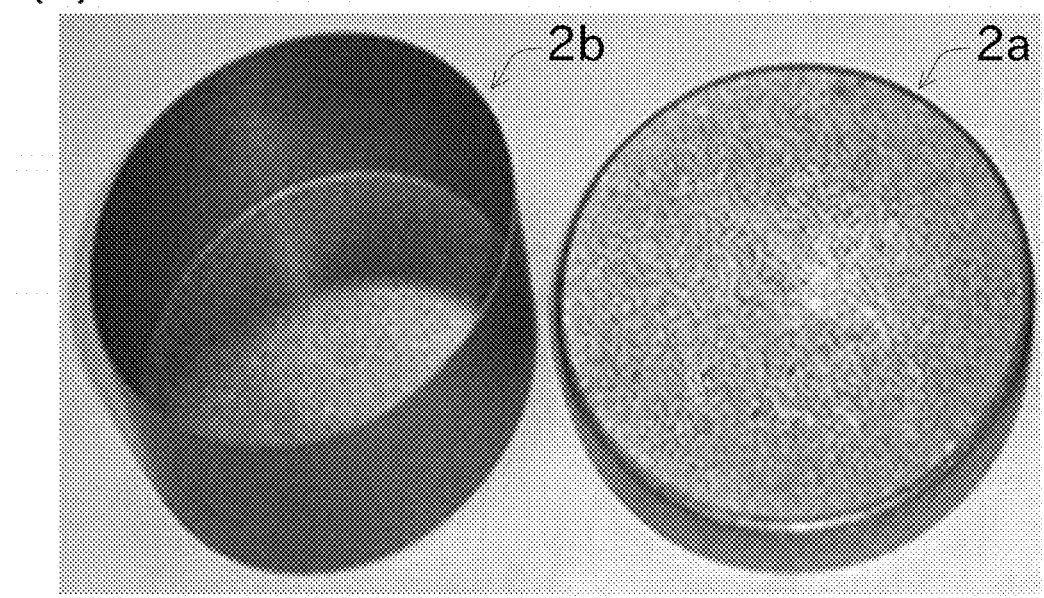
FIG. 6 Photographs of an external appearance and a cross-section of a crucible having a carbon getter effect.
Figure 6:
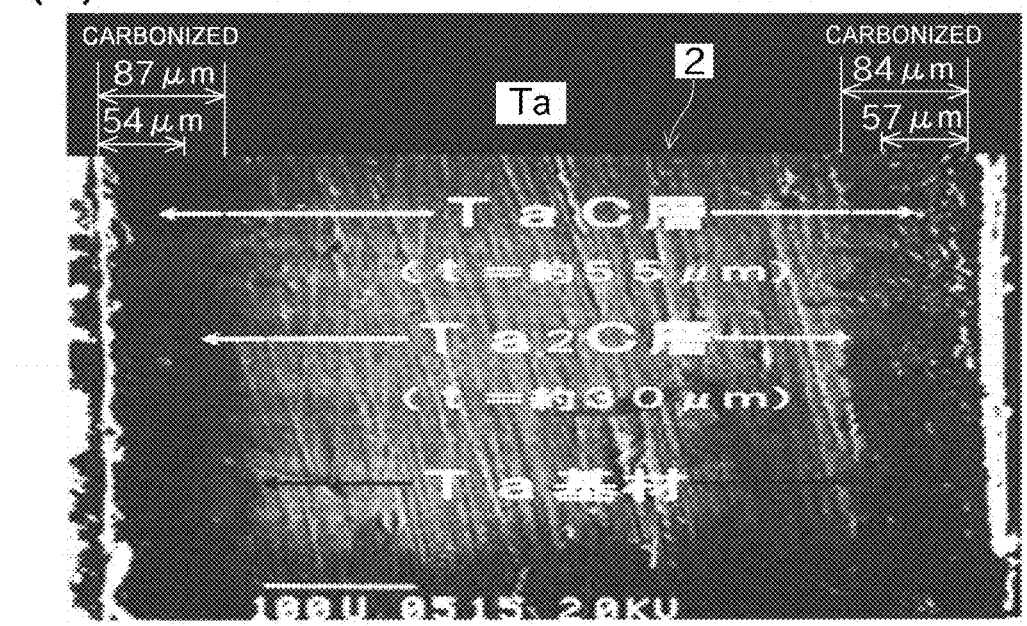
Figure 7:
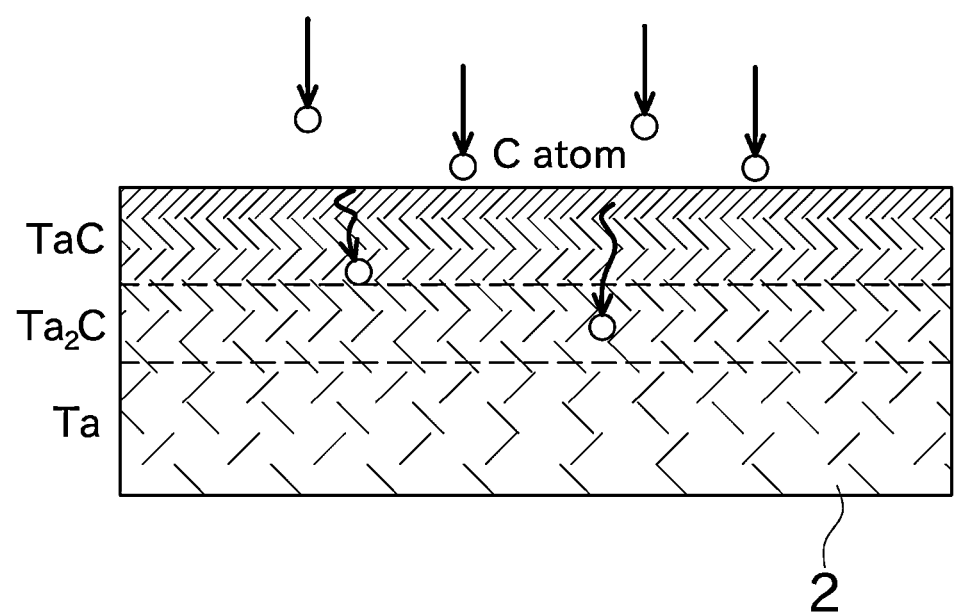
FIG. 7 A schematic view for explanation of the carbon getter effect.

Next, a high-temperature vacuum furnace 11 and a crucible (container) 2 used in manufacturing of a standard sample (nanometer standard prototype) for calibration of the AFM or the STM will be described with reference to FIGS. 4 to 7. FIG. 4 is a schematic view showing a high-temperature vacuum furnace for use in a heat treatment for manufacturing a standard sample. FIG. 5 is a cross-sectional view showing details of a main heating chamber and a preheating chamber of the high-temperature vacuum furnace. FIG. 6(a) is a photograph of an external appearance of the crucible 2 as photographed from the upper side thereof. FIG. 6(b) is a microscope photograph of a cross-section of the crucible 2. FIG. 7 is a schematic view for explanation of a carbon getter effect.

As shown in FIGS. 4 and 5, the high-temperature vacuum furnace 11 includes a main heating chamber 21 and a preheating chamber 22. The main heating chamber 21 enables a processing object to be heated to a temperature of 1000° C. or more and 2300° C. or less. The preheating chamber 22 enables a processing object to be preheated to a temperature of 500° C. or more. The preheating chamber 22 is arranged below the main heating chamber 21, and adjacent to the main heating chamber 21 with respect to the vertical direction. The high-temperature vacuum furnace 11 includes a heat insulating chamber 23 arranged below the preheating chamber 22. The heat insulating chamber 23 is adjacent to the preheating chamber 22 with respect to the vertical direction.

The high-temperature vacuum furnace 11 includes a vacuum chamber 19. The main heating chamber 21 and the preheating chamber 22 are arranged inside the vacuum chamber 19. A turbo-molecular pump 34 serving as a vacuum-producing apparatus is connected to the vacuum chamber 19, so that a vacuum of, for example, $10^{-2}$ Pa or less, and desirably $10^{-7}$ Pa or less, can be produced inside the vacuum chamber 19. A gate valve 25 is interposed between the turbo-molecular pump 34 and the vacuum chamber 19. A rotary pump 26 for auxiliary use is connected to the turbo-molecular pump 34.

The high-temperature vacuum furnace 11 includes a moving mechanism 27 that is configured to vertically move a processing object at a location between the preheating chamber 22 and the main heating chamber 21. The moving mechanism 27 includes a support member 28 and a cylinder part 29. The support member 28 is configured to support a processing object. The cylinder part 29 is configured to move the support member 28 in the vertical direction. The cylinder part 29 includes a cylinder rod 30. One end of the cylinder rod 30 is coupled to the support member 28. A vacuum meter 31 for measuring the degree of vacuum and a mass spectrometry apparatus 32 for performing mass spectrometry are provided in the high-temperature vacuum furnace 11.

The vacuum chamber 19 is connected via a transport path 65 to a stock storage (not shown) for storing processing objects. The transport path 65 can be opened and closed by a gate valve 66.

The main heating chamber 21, whose cross-section has a regular hexagonal shape in a plan view, is arranged in an upper portion of an internal space of the vacuum chamber 19. As shown in FIG. 5, a mesh heater 33 serving as a heating apparatus is provided in the main heating chamber 21. A first multi-layer heat reflection metal plate 41 is fixed to a sidewall and a ceiling of the main heating chamber 21. The first multi-layer heat reflection metal plate 41 is configured to reflect heat of the mesh heater 33 toward a central area of the main heating chamber 21.

As a result, a layout in which the mesh heater 33 surrounds a processing object which is an object of a heat treatment and the multi-layer heat reflection metal plate 41 is arranged further outside the mesh heater 33 is achieved within the main heating chamber 21. This enables the processing object to be strongly and uniformly heated, and its temperature to be raised up to 1000° C. or more and 2300° C. or less.

The ceiling side of the main heating chamber 21 is closed by the first multi-layer heat reflection metal plate 41. The first multi-layer heat reflection metal plate 41 arranged on a bottom surface of the main heating chamber 21 has a through hole 55. The processing object is movable through the through hole 55 between the main heating chamber 21 and the preheating chamber 22 arranged below and adjacent to the main heating chamber 21.

A portion of the support member 28 of the moving mechanism 27 is received in the through hole 55. The support member 28 includes a second multi-layer heat reflection metal plate 42, a third multi-layer heat reflection metal plate 43, and a fourth multi-layer heat reflection metal plate 44, which are arranged in this order from the upper side and which are spaced apart from one another.

The three multi-layer heat reflection metal plates 42 to 44, all of which are provided horizontally, are coupled to one another by column portions 35 that is provided vertically. A tray 36 is arranged in a space formed between the second multi-layer heat reflection metal plate 42 and the third multi-layer heat reflection metal plate 43. The processing object can be placed on the tray 36. In this embodiment, the tray 36 is made of tantalum carbide.

A flange is formed in an end portion of the cylinder rod 30 of the cylinder part 29. The flange is fixed to a lower surface of the fourth multi-layer heat reflection metal plate 44. In this configuration, extension and contraction of the cylinder part 29 enable the processing object placed on the tray 36 to vertically move together with the three multi-layer heat reflection metal plates 42 to 44.

The preheating chamber 22 is formed by a multi-layer heat reflection metal plate 46 enclosing a space existing below the main heating chamber 21. The preheating chamber 22 has a circular cross-section in a plan view. A heating element such as the mesh heater 33 is not provided in the preheating chamber 22.

As shown in FIG. 5, the multi-layer heat reflection metal plate 46 arranged on a bottom surface of the preheating chamber 22 has a through hole 56. The multi-layer heat reflection metal plate 46 that defines a sidewall of the preheating chamber 22 has a passage hole 50. The passage hole 50 is formed at a location opposed to the transport path 65. The high-temperature vacuum furnace 11 further includes an open/close member 51 that is configured to close the passage hole 50.

The heat insulating chamber 23 arranged below and adjacent to the preheating chamber 22 has its upper portion defined by the multi-layer heat reflection metal plate 46 and its lower and side portions defined by a multi-layer heat reflection metal plate 47. The multi-layer heat reflection metal plate 47 that covers the lower side of the heat insulating chamber 23 has a through hole 57, through which the cylinder rod 30 can be received.

The multi-layer heat reflection metal plate 47 has a storage recess 58. The storage recess 58 is formed at a position corresponding to an upper end portion of the through hole 57. The storage recess 58 is configured to store the fourth multi-layer heat reflection metal plate 44 of the support member 28.

Any of the multi-layer heat reflection metal plates 41 to 44, 46, 47 is structured such that metal plates (made of tungsten) are stacked with predetermined intervals therebetween. A multi-layer heat reflection metal plate having the same configuration is also adopted as a portion of the open/close member 51 that closes the passage hole 50.

Any material is adoptable for the multi-layer heat reflection metal plates 41 to 44, 46, 47, as long as the material has sufficient heating characteristics relative to thermal radiation of the mesh heater 33 and the melting point of the material is higher than the ambient temperature. For example, not only the tungsten, but also a metal material having a high melting point, such as tantalum, niobium, and molybdenum, is adoptable for the multi-layer heat reflection metal plates 41 to 44, 46, 47. Alternatively, a carbide such as tungsten carbide, zirconium carbide, tantalum carbide, hafnium carbide, and molybdenum carbide is adoptable for the multi-layer heat reflection metal plates 41 to 44, 46, 47. It may be also acceptable that an infrared reflective coating made of gold, tungsten carbide, or the like, is further formed on reflecting surfaces of the multi-layer heat reflection metal plates 41 to 44, 46, 47.

Each of the multi-layer heat reflection metal plates 42 to 44 provided in the support member 28 includes tungsten plates each having a perforated metal structure in which many small through holes are formed. The tungsten plates are stacked with predetermined interval therebetween and with the positions of the through holes being misaligned from one another.

The number of the second multi-layer heat reflection metal plates 42 stacked in the uppermost layer of the support member 28 is less than the number of the first multi-layer heat reflection metal plates 41 stacked in the main heating chamber 21.

In this configuration, a processing object (for example, a SiC substrate) is received in a proper casing for prevention of contamination of the inside of the vacuum chamber 19. The casing may be the crucible 2 which will be described later, or may be another casing. In this condition, the processing object is introduced into the vacuum chamber 19 through the transport path 65, and placed on the tray 36 arranged in the preheating chamber 22. In this condition, the mesh heater 33 is driven, so that the main heating chamber 21 is heated to a predetermined temperature of 1000° C. or more and 2300° C. or less (for example, about 1900° C.). At this time, by driving the turbo-molecular pump 34, the pressure in the vacuum chamber 19 is adjusted to $10^{-3}$ Pa or less, and preferably $10^{-5}$ Pa or less.

As mentioned above, the number of the second multi-layer heat reflection metal plates 42 stacked in the support member 28 is less than the number of the first multi-layer heat reflection metal plates 41 stacked. Therefore, part of the heat generated by the mesh heater 33 can be moderately supplied (distributed) to the preheating chamber 22 via the second multi-layer heat reflection metal plates 42 so that the processing object placed in the preheating chamber 22 is preheated to a predetermined temperature of 500° C. or more (for example, 800° C.). Thus, preheating is achieved even though no heater is provided in the preheating chamber 22, and a simple structure of the preheating chamber 22 is achieved.

After the above-mentioned preheating treatment is performed for a predetermined time period, the cylinder part 29 is driven to move up the support member 28. As a result, the processing object passes through the through hole 55 from the lower side thereof, and moves into the main heating chamber 21. This allows the heat treatment to be started immediately, and the temperature of the processing object placed in the main heating chamber 21 can be rapidly raised to a predetermined temperature (about 1900° C.).

Next, the crucible (container) 2 will be described. As shown in FIG. 6(a), the crucible 2 is a fitted casing including an upper casing 2a and a lower casing 2b that are fittable to each other. The crucible 2 is configured to exert a carbon getter effect, which will be described later, in a case of performing a high temperature treatment. More specifically, the crucible 2 is made of tantalum metal, and includes a tantalum carbide layer that is exposed to an internal space of the crucible 2. Silicon pellets (not shown) serving as a silicon supply source is received in the crucible 2. This enables the crucible 2 to successfully exert a carbon getter function, and a high-purity silicon atmosphere can be kept in the internal space of the crucible 2.

In more detail, as shown in FIG. 6(b), the crucible 2 includes a TaC layer formed in a most superficial layer, a $Ta_2C$ layer formed inner than the TaC layer, and tantalum metal, which serves as a base material, arranged further inner than the $Ta_2C$ layer. Since the state of bonding between tantalum and carbon exhibits a temperature dependency, the crucible 2 is configured such that TaC having a high carbon concentration is arranged in a most superficial portion, $Ta_2C$ having a relatively less carbon concentration is arranged inside, and tantalum metal serving as the base material, whose carbon concentration is zero, is arranged further inside $Ta_2C$.

To perform a heat treatment on the crucible 2, as indicated by a chain line in FIG. 5, the crucible 2 is placed in the preheating chamber 22 of the high-temperature vacuum furnace 11 and preheated at a proper temperature (for example, about 800° C.). Then, by driving the cylinder part 29, the crucible 2 placed in the preheating chamber 22 is moved into the main heating chamber 21 in which the temperature has been preliminarily raised to a set temperature (for example, about 1900° C.). Then, the temperature is raised rapidly.

It is preferable that, during the heating performed in the main heating chamber 21, the atmosphere in the crucible 2 is kept at about 1 Pa or less. It is preferable that the upper casing 2a and the lower casing 2b are fitted to each other with an allowance of about 3 mm or less left in a fitted portion. This achieves substantially hermetic sealing, and enables the pressure of silicon within the crucible 2 to increase to pressure higher than the external pressure (the pressure within the main heating chamber 21) during the heat treatment performed in the main heating chamber 21. Thereby, entry of impurities into the crucible 2 through the fitted portion.

Due to this temperature rise, the internal space of the crucible 2 is kept at a silicon vapor pressure. As mentioned above, the crucible 2 has its surface covered with the tantalum carbide layer, and the tantalum carbide layer (TaC layer) is exposed to the internal space of the crucible 2. Accordingly, as long as the high temperature treatment is performed in a vacuum as described above, the crucible 2 exerts a function for continuous adsorption and intake of carbon atoms from a surface of the tantalum carbide layer, as shown in FIG. 7. In this sense, it can be said that the crucible 2 of this embodiment has a carbon atom adsorption ion pump function (ion getter function). Thus, in silicon vapor and silicon carbide vapor contained in the atmosphere within the crucible 2 during the heat treatment, only carbon is selectively adsorbed and stored in the crucible 2. This can keep a high purity silicon atmosphere within the crucible 2.

In this embodiment, the high-temperature vacuum furnace 11 and the crucible 2 having the above-described configurations are used to manufacture a standard sample 72 from a SiC substrate 70. In the following description, a heat treatment using the above-described high-temperature vacuum furnace 11 will be referred to simply as, for example, a heat treatment.

Next, a method for manufacturing a standard sample will be described. Characteristics required of a standard sample are different depending on an atmosphere in which calibration is performed, a measuring instrument that is an object to be calibrated, and the like. In the following, a standard sample 72 for calibration of a measuring instrument (such as an AFM) to be measured and calibrated in the atmosphere will be firstly described, and a standard sample 102 for calibration of a measuring instrument (such as an STM) to be measured and calibrated in a high-temperature vacuum will be then described.

Figure 8:
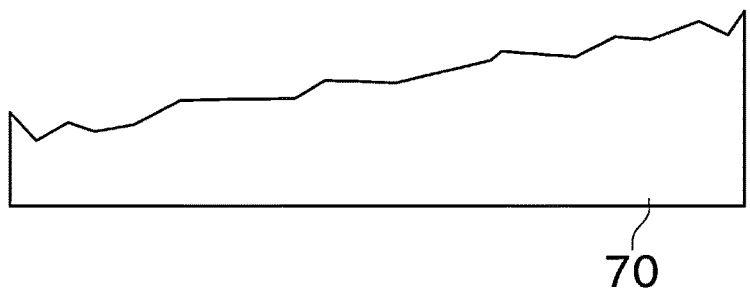
FIG. 8 A conceptual diagram showing a process for manufacturing a standard sample for calibration of an AFM.
Figure 8:
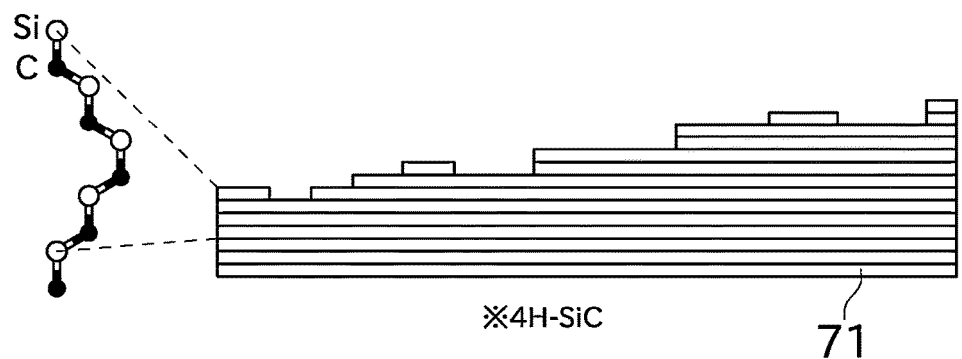
Figure 8:
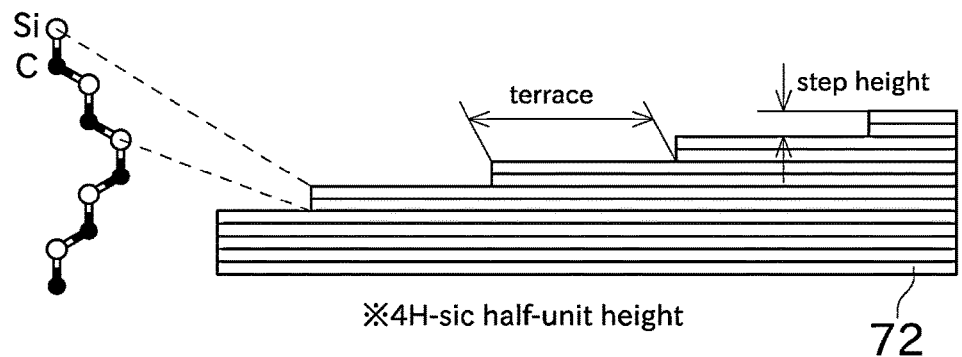

A method for manufacturing the standard sample 72 will be described with reference to FIGS. 8 and 9. FIG. 8 is a conceptual diagram showing a process for manufacturing a nanometer standard prototype for calibration of an AFM. FIG. 9 is a schematic view showing a situation where the SiC substrate 70 obtained after mechanical polishing is received in the crucible 2.

In this embodiment, the SiC substrate 70 having a predetermined off angle is used to manufacture the standard sample 72. To obtain the SiC substrate 70 of this type, one having the predetermined off angle may be purchased off the shelf, or alternatively a SiC substrate whose surface has a just plane may be polished. A surface on which the off angle is formed may be a (0001) Si face or a (000-1) C face.

Even in a substrate surface having a predetermined off angle, if mechanical polishing or the like has been performed on the surface, the surface of the SiC substrate 70 macroscopically appears to be flat. Microscopically, however, there is unevenness as schematically shown in FIG. 8(a). To allow the use of the SiC substrate 70 as a standard sample, a planarization process for planarizing the unevenness to the molecular level is necessary.

The planarization process is performed by heating the SiC substrate 70 at a high temperature under Si vapor pressure by using the high-temperature vacuum furnace 11 described in FIG. 4. This heat treatment is preferably performed in a temperature range of 1500° C. or more 2300° C. or less. This heat treatment is preferably performed in a state where the SiC substrate 70 is received in the crucible 2 as shown in FIG. 9.

A specific description will be given of the heat treatment for planarization. The heat treatment includes a preheating step and a main heating step. In the preheating step, the crucible 2 having the SiC substrate 70 received therein is heated in the preheating chamber 22 at a temperature of 800° C. or more. In the main heating step, the crucible 2 is moved from the preheating chamber to the main heating chamber 21 that has been preliminarily heated at a predetermined temperature. In this condition, the SiC substrate 70 is heated at a temperature of 1500° C. or more 2300° C. or less for a predetermined time period (for example, 10 minutes). Preliminarily preheating the crucible 2 having the SiC substrate 70 received therein and moving the SiC substrate 70 from the preheating chamber 22 to the main heating chamber 21 in the above-described manner enables a rapid temperature rise in the SiC substrate 70 when performing the heat treatment.

Through this treatment, a surface part of the SiC substrate 70, in which unevenness has been formed due to the mechanical polishing, is vapor-etched and planarized to the molecular level as shown in FIG. 8(b). Thus, the SiC substrate 71 having a step-terrace structure can be generated. That is, as a result of heating at a high temperature under Si vapor pressure, SiC in the surface of the SiC substrate 70 changes into $Si_2C$ or $SiC_2$ and sublimes, so that the surface is planarized. A heating temperature at this time is preferably 1500° C. or more 2300° C. or less, as mentioned above. The SiC substrate 71 planarized to the molecular level is further subjected to a heat treatment under Si vapor pressure in a gaseous atmosphere at 1800° C. or more and 2000° C. or less. Thereby, steps having a uniform terrace width are obtained as shown in FIG. 8(c). Through the process thus far described, the standard sample 72 is manufactured.

The value of the terrace width formed at this time is determined by the height of the step (which can be selected based on the temperature, the type of the SiC substrate 70, and the like, as will be described later) and the off angle of the SiC substrate 70. For example, when the off angle is increased or the height of the step is lowered, a formed terrace has a smaller terrace width. On the other hand, when the off angle is reduced or the height of the step is raised, a formed terrace has a greater terrace width.

Next, the relationship between the heating temperature and the planarization will be described with reference to FIGS. 10 to 13.

FIG. 10 is a graph showing the relationship between a vapor annealing processing temperature under Si vapor pressure and the average surface roughness. The graph of FIG. 10 shows, with respect to single crystal SiC (4H—SiC), the relationship of the average roughness (nm) relative to the temperature (annealing temperature) of the heat treatment on a (0001) Si face and the relationship of the average roughness (nm) relative to the temperature of the heat treatment on a (000-1) C face. As shown in the graph of FIG. 10, performing the heat treatment at a high temperature of 1500° C. or more results in the average roughness equal to or less than 1.0 nm. This reveals that, in a high temperature environment, planarization of the surface of the SiC substrate 70 progresses efficiently.

FIG. 11 is a graph showing the relationship between a vapor annealing processing temperature under Si vapor pressure and the height of a step formed in the surface. In FIG. 11, (a) is a microscope photograph of the surface of the standard sample 72 terminated at a full-unit height. In FIG. 11, (b) is a microscope photograph of the surface of the standard sample 72 terminated at a half-unit height. As shown in the graph of FIG. 11, the termination of the step at the full-unit height and the half-unit height is advanced in a high temperature region.

Here, the half-unit height and the full-unit height will be described with reference to FIG. 12. FIG. 12 is a schematic view for explanation of molecular arrangements periodic of 4H—SiC single crystal and 6H—SiC. The terminology "full-unit height" means the height corresponding to one periodic of a stack of SiC single molecular layers including Si and C with respect to a stack direction, as shown in FIG. 12. Therefore, in a case of 4H—SiC, a step having the full-unit height means a step having a height of 1.01 nm. The terminology "half-unit height" means the height corresponding to half the one periodic with respect to the stack direction. Therefore, in a case of 4H—SiC, a step having the half-unit height means a step having a height of 0.50 nm. In a case of 6H—SiC, a step having the full-unit height means a step having a height of 1.51 nm, and a step having the half-unit height means a step having a height of 0.76 nm.

FIG. 13 is an SEM photograph showing a surface obtained in a case where a step with the height corresponding to one periodic in the C-axis direction is formed in a (0001) Si face of a SiC layer. In FIG. 13, a portion (curved line) where the step is formed is thin. This shows that each of the formed steps is raised sharply. Additionally, no unevenness is observed in each terrace, it can be found that the planarization has been performed accurately.

As seen from the experimental results (graphs and photographs) given above, heating under Si vapor pressure at a high temperature for a predetermined time period enables planarization to the molecular level (the full-unit height or the half-unit height), which would be very difficult to achieve by mechanical polishing or etching.

Next, the standard sample 72 manufactured through the manufacturing method of this embodiment and a standard sample 81 manufactured through a conventional method are compared with each other with reference to FIGS. 14 and 15.

FIG. 14(a) is a diagram showing the shape of a surface of the conventional standard sample 81 that adopts a Si substrate. FIG. 14(b) is a schematic cross-sectional view of the conventional standard sample 81 that adopts the Si substrate. FIG. 15(a) is a diagram showing the shape of the surface of the standard sample 72 of this embodiment. FIG. 15(b) is a diagram showing a cross-section shape of the step of the standard sample 72 of this embodiment. FIG. 15(c) is a schematic cross-sectional view of the standard sample 72 of this embodiment.

Firstly, a brief description will be given of the conventional standard sample 81. The standard sample 81 is a silicon step substrate, which is manufactured through the method described as the conventional technique in the above. The height of a step formed in the standard sample 81 is the height corresponding to two silicon atomic layers, which is 0.31 nm.

Actually, however, unevenness is generated in the terrace because of, for example, oxidation of a silicon surface. Therefore, the terrace width is non-uniform as shown in FIG. 14(a), and the height of the step cannot achieve a high accuracy of 0.31 nm. Furthermore, the accuracy of the shape of the step gradually decreases due to oxidation of silicon which is caused over time by reaction of silicon with oxygen in the atmosphere.

Next, the standard sample 72 of this embodiment will be described. In the standard sample 72 shown in FIG. 15, steps having the half-unit height are formed in a 4H—SiC substrate 70 having an off angle of one degree.

As shown in FIG. 15(b), the terrace formed in the standard sample 72 is flat. Moreover, the surface of the step formed in the standard sample 72 is not roughened even when time elapses. In addition, since SiC has a higher melting point than that of Si, the standard sample 72 of this embodiment can be used for calibration or the like even in a high temperature environment, in which the conventional standard sample 81 could not be used.

The widths of the terraces formed in the standard sample 72 are uniform as shown in FIG. 15(a). Since calibration of an AFM is performed by using the height of the step formed in the standard sample 72, 81, the degree of uniformity of the width of the terrace has no direct influence on the accuracy of the calibration of the AFM. However, if a portion having a narrow terrace width is formed, fine unevenness of the terrace surface has a relatively increased influence in this portion, which is not preferable from the viewpoint of stable calibration of the AFM. In this respect, the standard sample 72 of this embodiment has a uniform terrace width. This enables calibration to be performed with a good accuracy wherever in the standard sample 72 the calibration is performed.

A standard sample manufactured from the single crystal sapphire substrate disclosed in the Patent Documents 2 and 3 is less likely to react with the atmosphere. In this point, the standard sample can be considered to be equivalent to the standard sample 72 of this embodiment. However, as shown in the drawings of the Patent Document 2, the standard sample manufactured from the single crystal sapphire substrate has a non-uniform terrace width, and moreover the flatness of the step is inferior to that of the standard sample 72 according to the invention of the present application.

As described above, the manufacturing method of this embodiment allows the height of the formed step to be selected from four kinds by changing the temperature, or the like. As a result, four different standard lengths can be provided for calibration. Any of the four standard lengths thus obtained has a very high accuracy. This can considerably improve the accuracy of measurement of the AFM which normally has a size of about 0.1 nm. Performing the calibration by using at least two of the standard lengths enables linear characteristics of an evaluation apparatus relative to measured values to be examined in the order of nanometers or less.

As thus far described above, the standard sample 72 which is a nanometer standard prototype has a standard length that serves as a length reference. The standard sample 72 includes a SiC layer having a step-terrace structure. The height of the step is equal to the height of the full unit that corresponds to one periodic of SiC molecules in the stack direction or to the height of the half unit that corresponds to one-half periodic of SiC molecules in the stack direction. The height of the step is used as the standard length.

Since SiC is used as a material, the standard sample 72 having an excellent heat resistance is achieved. Besides, since SiC is less likely to react with a substance contained in the atmosphere, such as oxygen, the standard sample 72 that is able to maintain the accuracy of the height of the step for a long time is achieved.

Next, a method for manufacturing a standard sample for calibration of an STM will be described with reference to FIGS. 16 and 17. FIG. 16 is a conceptual diagram showing a process for manufacturing a nanometer standard prototype for calibration of an STM. FIG. 17 is a schematic plan view conceptually showing a ($\sqrt{2} \times \sqrt{3}$)–30° pattern or a ($6\sqrt{3} \times 6\sqrt{3}$)–30° pattern of a SiC crystal lattice.

As mentioned above, measurement and calibration of the STM are often performed at a high temperature and in a vacuum. Therefore, a standard sample usable in such an environment is demanded. In the following, a standard sample for calibration of an STM is denoted by the reference numeral 102, and a method for manufacturing the standard sample 102 will be described.

As mentioned above, in a case of calibration using an STM, the standard sample 102 needs to have conductive properties. To manufacture the standard sample 102 for calibration of an STM, a SiC substrate 100 having conductive properties is adopted. Although it is preferable that the SiC substrate 100 is given a resistivity of 0.3 Ωcm or less by doping of impurities such as nitrogen, a higher or lower resistivity is acceptable. The conductive properties may be given by doping impurities having conductive properties other than nitrogen.

In a case of making the standard sample 102 for calibration of an STM, similarly to the standard sample 72 for AFM calibration, an off angle is provided to a substrate and mechanical polishing is performed. In a case of making the standard sample 72 for calibration of an AFM, the off angle may be provided to either of a (0001) Si face surface and a (000-1) C face surface. On the other hand, in a case of making the standard sample 102 for calibration of an STM, the off angle is provided to a (0001) Si face (see FIG. 16(a)). This is because forming a step in a Si-surface makes it easier to remove a natural oxide film formed on a surface of the substrate so that a stable surface reconstruction is obtained.

Then, in the same manner as described above, a planarization process is performed on the SiC substrate 100 having the off angle. In the planarization process, similarly to the case of manufacturing the standard sample 72, the SiC substrate 100 is received in the crucible 2 and the SiC substrate 100 is heated under Si vapor pressure at a high temperature. This heat treatment is preferably performed in a temperature range of 1500° C. or more 2300° C. or less. This heat treatment may be performed in two stages of the preheating step and the main heating step, in the same manner as described above.

Through this heat treatment, a surface part of the SiC substrate 70 is vapor-etched and planarized to the molecular level as shown in FIG. 16(b). Thus, a step-terrace structure is formed. The SiC substrate 101 is further subjected to a heat treatment under Si vapor pressure at 1800° C. or more and 2000° C. or less. Thereby, the standard sample 102 in which steps having a uniform terrace width are formed is obtained as shown in FIG. 16(c).

Although the standard sample 102 is less likely to react with a gas molecule, a small amount of natural oxide film may be formed on the surface of the standard sample 102 if, for example, the standard sample 102 is left in the atmosphere for a long time. This natural oxide film acts as an insulation coating. Therefore, in the standard sample 102 on which a natural oxide film is formed, a tunneling current is not likely to flow. This is way it is preferable that a natural oxide film formed on the standard sample 102 is easy to remove.

In this respect, in this embodiment, a (0001) Si face serves as a surface (a surface having a step-terrace structure) of the standard sample 102. Raising the temperature in a vacuum allows a natural oxide film to be removed easily.

It is preferable that a heat treatment for removing a natural oxide film is performed at 800° C. or more and 1400° C. or less in a vacuum furnace provided in an STM. However, a heating temperature different from the aforementioned one may be acceptable as long as the heating temperature allows a natural oxide film formed on the surface of the standard sample 102 to be removed.

As a result of this heat treatment, the natural oxide film is removed. This enables the standard sample 102 to successfully exert conductive properties. Removal of the natural oxide film causes a surface reconstruction to occur on the surface of the standard sample 102.

In the conventional standard sample, generally, occurrence of a surface reconstruction deteriorates the flatness of a terrace, which makes the use as a standard sample impossible. In this respect, this embodiment provides an ordered pattern of the single crystal SiC molecular arrangement. Accordingly, even when a surface reconstruction occurs, a deterioration in the surface flatness can be prevented. Hence, the standard sample 102 of this embodiment is able to maintain its function well even under a high-temperature vacuum.

In the following, a pattern including a SiC crystal lattice of a surface reconstruction occurring on the standard sample 102 will be described with reference to FIG. 17. Removal of a natural oxide film results in a reconstruction of a single crystal SiC molecular arrangement on the surface (Si-surface) of the standard sample 102, so that a $(\sqrt{3} \times \sqrt{3})$–30° pattern or a $(6\sqrt{3} \times 6\sqrt{3})$–30° pattern is formed, as shown in FIG. 17 (see a thick line in FIG. 17).

Since a surface reconstruction in the standard sample 102 has a periodical pattern, the flatness of the terrace does not deteriorate even when the surface reconstruction occurs. This enables the height of the step to be maintained correctly even in a vacuum and high-temperature environment. Accordingly, the standard sample 102 is able to calibrate an STM, or the like, that is configured for measurement in such an environment, with a good accuracy.

Next, a modification of the above-described embodiment will be described with reference to FIG. 18. FIG. 18 is a schematic cross-sectional view showing step-terrace structures that are formed in both a Si-surface and a C-surface of the substrate.

In the standard sample 72, 102 of the above-described embodiment, the step-terrace structure is formed in only one of the Si-surface and the C-surface of the SiC substrate. In a standard sample 110 of this modification, in contrast, the step-terrace structures are formed in both the Si-surface and the C-surface of the SiC substrate.

The standard sample 110 can be manufactured in the same manner as in the above-described embodiment. To be specific, an off angle is provided to both a Si-surface and a C-surface of a SiC substrate having conductive properties, and a heat treatment is performed under Si vapor pressure. Thereby, the standard sample 110 can be manufactured.

The standard sample 110 is, for example, usable as a standard sample for calibration of both the AFM and the STM. As mentioned above, the environment in which the AFM is measured is under the atmospheric pressure at normal temperature. Therefore, either of the Si-surface and the C-surface of the standard sample 110 can be used to appropriately calibrate the AFM. the environment in which the STM is measured is under a high-temperature vacuum. Therefore, using the Si-surface of the standard sample 110 allows a natural oxide film to be removed easily as described above so that a stable surface reconstruction is obtained. Accordingly, calibration of the STM can be performed appropriately.

From the above, using the C-surface of the standard sample 110 for calibration of the AFM while using the Si-surface thereof for calibration of the STM achieves a multifunction nanometer standard prototype that can be used for calibration of a plurality of kinds of microscopes.

Although a preferred embodiment of the present invention has been described above, the above-described configuration can be modified, for example, as follows.

The material of the crucible 2 serving as a container is not limited to tantalum carbide. For example, the crucible 2 may be made of a metal other than tantalum if the metal has a getter effect exerted on a carbon element, is not high-temperature bonded to a SiC substrate, has a heat resistance against a temperature of about 2000° C., and is a ultrahigh vacuum material.

The above-described embodiment illustrates a standard sample for calibration of an AFM and an STM and a method for manufacturing the standard sample, the present invention is applicable to various nanometer standard prototypes and methods for manufacturing them, as long as the height of a formed step is used as a standard length. For example, standard samples for calibration of measuring instruments such as an electron microscope, a light interference microscope, and a laser microscope, may be mentioned.

In so far as the present invention is applied, needless to say, the manufacturing method thus far described above can be partially varied. The temperature condition, the pressure condition, and the like, adopted in the above-described embodiment are illustrative examples, and they can be changed as appropriate in accordance with circumstances such as an apparatus configuration, a required standard length, and the like.

DESCRIPTION OF THE REFERENCE NUMERALS 2 crucible (container)
70 SiC substrate
71 SiC substrate having its surface planarized to molecular level
72 standard sample
100 SiC substrate
101 SiC substrate having its surface planarized to molecular level
102 standard sample
110 standard sample

The invention claimed is:

1. A nanometer standard prototype having a standard length that serves as a length reference,
the nanometer standard prototype comprising a substrate that includes a single crystal SiC layer having a surface in which a step-terrace structure is formed,
wherein the step-terrace structure includes a plurality of steps and a plurality of terraces formed in the SiC layer,
wherein the steps have a uniform height and the terraces have a uniform width,
wherein the step-terrace structure covers an entirety of the surface of the single crystal SiC layer,
wherein the height of each of the plurality of steps is equal to a height of a full unit that corresponds to one periodic of a stack of single crystal SiC molecules in a stack direction or equal to a height of a half unit that corresponds to one-half periodic of the stack of single crystal SiC molecules in the stack direction,
wherein the height of the steps is used as the standard length,
wherein the uniform width of the terraces is about 300 nm or more,
wherein the SiC layer is made of 4H—SiC single crystal or 6H—SiC single crystal, and
wherein an off angle on a surface of the SiC layer is capable of being adjusted to one degree or less.

2. The nanometer standard prototype according to claim 1, wherein
the off angle is provided on a (0001) Si face or a (000-1) C face of the SiC layer of 4H or 6H polytype, and
the step-terrace structure formed in the substrate is in conformity with the off angle, the step-terrace structure being formed by performing a heat treatment on the substrate under Si vapor pressure in a temperature range of 1500° C. or more 2300° C. or less, to cause a surface of the substrate to be vapor-etched and planarized to a molecular level and to form a step corresponding to one periodic or one-half periodic of a single crystal SiC molecular arrangement.

3. The nanometer standard prototype according to claim 2, wherein
the heat treatment for the formation of the step-terrace structure is performed in a container made of tantalum metal and including a tantalum carbide layer that is exposed in an internal space of the container.

4. The nanometer standard prototype according to claim 1, wherein
adjusting an off angle of a surface in which the step-terrace structure is formed allows formation of a terrace having any terrace width.

5. The nanometer standard prototype according to claim 1, wherein
a surface of the substrate is a (0001) Si face of the SiC layer of 4H or 6H polytype, and
wherein each terrace of the step-terrace structure in the surface of the substrate has a surface configuration in which a ($\sqrt{3}\times\sqrt{3}$)-30° pattern or a ($6\sqrt{3}\times6\sqrt{3}$)-30° pattern including a single crystal SiC molecular arrangement structure is formed, the step-terrace structure being formed by performing a heat treatment on the substrate under Si vapor pressure in a temperature range of 1500° C. or more 2300° C. or less, to cause the surface of the substrate to be vapor-etched and planarized to a molecular level.

6. The nanometer standard prototype according to claim 5, wherein
even when the substrate is maintained in the atmosphere so that a natural oxide film is formed on a surface of the SiC layer, heating the substrate in a vacuum state in a temperature range of 800° C. or more and 1400° C. or less causes the natural oxide film to be removed from the surface of the SiC layer and causes a reconstruction of the single crystal SiC molecular arrangement formed on the surface of the SiC layer to occur so that a ($\sqrt{3}\times\sqrt{3}$)-30° pattern or a ($6\sqrt{3}\times6\sqrt{3}$)-30° pattern is formed.

7. The nanometer standard prototype according to claim 6, wherein
a predetermined off angle is provided on the (0001) Si face that is the surface of the substrate before planarization of the SiC layer, so that a step-terrace structure is formed in the surface of the substrate at a time of planarization of the SiC layer.

8. The nanometer standard prototype according to claim 5, wherein
the substrate is a conductive substrate given a resistivity of 0.3 Ωcm or less by doping of an impurity.

9. The nanometer standard prototype according to claim 5, wherein
the step-terrace structure is formed in both a Si-surface and a C-surface of the substrate.

10. A standard sample for calibration of a measuring instrument, comprising:
the nanometer standard prototype according to claim 5.

11. The nanometer standard prototype according to claim 1, wherein
the step-terrace structure is formed in both a Si-surface and a C-surface of the substrate.

12. A standard sample for calibration of a measuring instrument, comprising:
the nanometer standard prototype according to claim 1.

13. The nanometer standard prototype according to claim 1, wherein
the uniform width of the terraces is about 500 nm or less.

14. A method for manufacturing a nanometer standard prototype configured such that a step-terrace structure is formed on a substrate whose surface includes a single crystal SiC layer, a height of a step being equal to a height of a full unit that corresponds to one periodic of a stack of single crystal SiC molecules in a stack direction or equal to a height of a half unit that corresponds to one-half periodic of the stack of single crystal SiC molecules in the stack direction, and the height of the step being used as a standard length, the method comprising:
an off-angle providing step of providing an off angle on a (0001) Si face or a (000-1) C face of a surface of a substrate of 4H or 6H polytype; and
a step-terrace structure formation step of forming a step-terrace structure that is in conformity with the off angle in the surface of the substrate by performing a heat treatment on the substrate under Si vapor pressure in a temperature range of 1500° C. or more 2300° C. or less, to cause the surface of the substrate to be vapor-etched and planarized to a molecular level and to form a step corresponding to one periodic or one-half periodic of a single crystal SiC molecular arrangement,
wherein the step-terrace structure includes a plurality of steps and a plurality of terraces formed in the SiC layer,
wherein the steps have a uniform height and the terraces have a uniform width,
wherein the step-terrace structure covers an entirety of the surface of the single crystal SiC layer,
wherein the uniform width of the terraces is about 300 nm or more,
wherein the SiC layer de of 4H—SiC single crystal or 6H—SiC single crystal,
wherein the height of each of the plurality of steps is equal to a height of a full unit that corresponds to one periodic of a stack of single crystal SiC molecules in a stack direction or equal to a height of a half unit that corresponds to one-half periodic of the stack of single crystal SiC molecules in the stack direction, and
wherein an off angle on a surface of the SiC layer is capable of being adjusted to one degree or less.

15. A method of calibrating a measuring instrument, comprising:
measuring the nanometer standard prototype produced by the method according to claim 14.

16. The method according to claim 13, wherein
the uniform width of the terraces is about 500 nm or less.

17. A method for manufacturing a nanometer standard prototype configured such that a step-terrace structure is formed on a substrate whose surface includes a single crystal SiC layer, a height of a step being equal to a height of a full unit that corresponds to one periodic of a stack of single crystal SiC molecules in a stack direction or equal to a height of a half unit that corresponds to one-half periodic of the stack of single crystal SiC molecules in the stack direction, and the height of the step being used as a standard length, the method comprising:
an off-angle providing step of providing an off angle on a (0001) Si face that is the surface of the substrate; and
a surface configuration formation step of performing a heat treatment on the substrate under Si vapor pressure in a temperature range of 1500° C. or more 2300° C. or less, to cause the surface of the substrate to be vapor-etched and planarized to a molecular level and to form a step corresponding to one full unit or half-unit cell height of a single crystal SiC molecular arrangement so that a step-terrace structure that is in conformity with the off angle is formed in the surface of the substrate, and forming, in each terrace, a surface configuration having a ($\sqrt{3}\times\sqrt{3}$)–30° pattern or a ($6\sqrt{3}\times6\sqrt{3}$)–30° pattern including a single crystal SiC molecular arrangement structure, wherein, even when the substrate is maintained in the atmosphere so that a natural oxide film is formed on a surface of the SiC layer, heating the substrate in a vacuum state in a temperature range of 800° C. or more and 1400° C. or less causes the natural oxide film to be removed from the surface of the SiC layer and causes a reconstruction of the single crystal SiC molecular arrangement formed on the surface of the SiC layer to occur so that a ($\sqrt{3}\times\sqrt{3}$)–30° pattern or a ($6\sqrt{3}\times6\sqrt{3}$)–30° pattern is formed, wherein the step-terrace structure includes a plurality of steps and a plurality of terraces formed in the SiC layer, the steps having a uniform height and the terraces have a uniform width, and the height of each of the plurality of steps being equal to a height of a full unit that corresponds to one periodic of a stack of single crystal SiC molecules in a stack direction or equal to a height of a half unit that corresponds to one-half periodic of the stack of single crystal SiC molecules in the stack direction, wherein the step-terrace structure covers an entirety of the surface of the single crystal SiC layer, wherein the uniform width of the terraces is about 300 nm or more, wherein the SiC layer is made of 4H—SiC single crystal or 6H—SiC single crystal, and wherein an off angle on a surface of the SiC layer is capable of being adjusted to one degree or less.

18. A method of calibrating a measuring instrument, comprising:

measuring the nanometer standard prototype produced by the method according to claim 17.

19. The method according to claim 17, wherein the uniform width of the terraces is about 500 nm or less.

* * * * *